US012682852B2

(12) United States Patent
Shang et al.

(10) Patent No.: US 12,682,852 B2
(45) Date of Patent: Jul. 14, 2026

(54) DISPLAY SUBSTRATE HAVING GATE DRIVING CIRCUIT AND DISPLAY DEVICE

(71) Applicant: BOE Technology Group Co., Ltd., Beijing (CN)

(72) Inventors: Guangliang Shang, Beijing (CN); Libin Liu, Beijing (CN); Li Wang, Beijing (CN); Yu Feng, Beijing (CN); Baoyun Wu, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 270 days.

(21) Appl. No.: 18/019,987

(22) PCT Filed: Feb. 24, 2022

(86) PCT No.: PCT/CN2022/077692
§ 371 (c)(1),
(2) Date: Feb. 6, 2023

(87) PCT Pub. No.: WO2022/252710
PCT Pub. Date: Dec. 8, 2022

(65) Prior Publication Data
US 2023/0282170 A1 Sep. 7, 2023

(30) Foreign Application Priority Data

May 31, 2021 (WO) ................ PCT/CN2021/097512

(51) Int. Cl.
*G06F 3/038* (2013.01)
*G09G 3/3266* (2016.01)
*G09G 3/36* (2006.01)
*G11C 19/28* (2006.01)
*H10K 59/121* (2023.01)
*G09G 3/20* (2006.01)

(52) U.S. Cl.
CPC ......... *G09G 3/3266* (2013.01); *G09G 3/3674* (2013.01); *G11C 19/28* (2013.01);
(Continued)

(58) Field of Classification Search
CPC .............. G09G 3/3266; G09G 3/3674; H10K 59/1213; H10K 59/1216
(Continued)

(56) References Cited

U.S. PATENT DOCUMENTS 10,453,386 B2 10/2019 Jang
10,872,677 B2 12/2020 Hou et al.
(Continued)

FOREIGN PATENT DOCUMENTS

CN 109448629 A 3/2019
CN 111128080 A 5/2020
(Continued)

OTHER PUBLICATIONS

May 23, 2024—(US)—Non-Final Office Action U.S. Appl. No. 17/781,133.

*Primary Examiner* — Jonathan M Blancha
(74) *Attorney, Agent, or Firm* — Banner & Witcoff, Ltd.

(57) ABSTRACT

A display substrate and a display device. The display substrate includes: a base substrate; and a gate driving circuit; the gate driving circuit includes a plurality of shift register circuits; each shift register circuit includes: an input circuit, a control circuit, an output circuit, and an output noise reduction circuit; the control circuit includes a first transistor, a second transistor, and a third transistor; the control circuit is connected to the first node, a second node and a third node; at least two selected from group consisting of an active layer of the first transistor, an active layer of the second transistor, and an active layer of the third transistor extend in a first direction and are arranged in the first direction.

18 Claims, 14 Drawing Sheets

(52) U.S. Cl.
CPC ..... *H10K 59/1213* (2023.02); *H10K 59/1216* (2023.02); *G09G 3/20* (2013.01); *G09G 2300/0408* (2013.01); *G09G 2300/0426* (2013.01); *G09G 2310/0281* (2013.01); *G09G 2310/0286* (2013.01); *G09G 2310/061* (2013.01); *G09G 2310/08* (2013.01)

(58) Field of Classification Search
USPC ........................................................ 345/206
See application file for complete search history.

(56)                         References Cited

U.S. PATENT DOCUMENTS

| | | | |
|---|---|---|---|
| 11,587,513 | B2 | 2/2023 | In et al. |
| 11,694,626 | B2 | 7/2023 | In et al. |
| 2016/0372068 | A1* | 12/2016 | Yamamoto ............. G11C 19/28 |
| 2017/0098413 | A1* | 4/2017 | Lee ...................... G09G 3/3233 |
| 2019/0304374 | A1* | 10/2019 | Wang ................... H10K 59/131 |
| 2019/0333596 | A1* | 10/2019 | Zhu ....................... G11C 19/287 |
| 2022/0028323 | A1* | 1/2022 | In ......................... G09G 3/2092 |
| 2022/0068212 | A1 | 3/2022 | Yao et al. |
| 2022/0310010 | A1 | 9/2022 | Cheng et al. |
| 2022/0392400 | A1 | 12/2022 | In et al. |
| 2023/0282170 | A1 | 9/2023 | Shang et al. |
| 2024/0078977 | A1 | 3/2024 | Wang et al. |

FOREIGN PATENT DOCUMENTS

| | | | |
|---|---|---|---|
| CN | 111445862 | A | 7/2020 |
| CN | 111445866 | A | 7/2020 |
| CN | 111816691 | A | 10/2020 |
| JP | 2015092427 | A | 5/2015 |

* cited by examiner

Gate 1

Gate2

LY1

LY2

OUT

S1                                    S2 t1  t2  t3  t4  t5  t6                t7

CK

CB

REset

In

Out

P1

P22

P2

P3

P21

P23

P4 stage of data refreshing          stage of data maintaining stage of noise      stage of noise
                                  reduction           reduction
                                  maintaining         enhancing

STV

CK                                      VDD

CB                                      VDD

CK'                                     VSS        VSS

CB'                                     VSS        VSS

| width of T4 (μm) | period of falling edge (μs) | remark |
|---|---|---|
| 4 | 13 | two steps are existed in the falling edge |
| 5 | 2.2 | |
| 6 | 2 | |
| 7 | 1.9 | |
| 8 | 1.9 | selection |
| 9 | 1.9 | |
| 10 | 1.9 | |
| 11 | 1.9 | |
| 12 | 1.9 | |

| width of T5 (μm) | period of falling edge (μs) | remark |
|---|---|---|
| 4 | 2.3 | reset delay |
| 5 | 7.7 | reset delay |
| 6 | 3.3 | reset delay |
| 7 | 2.7 | reset delay |
| 8 | 13 | two steps are existed in the falling edge |
| 9 | 2.9 | |
| 10 | 2.6 | |
| 11 | 2.4 | |
| 12 | 2.4 | selection |

FIG. 5C

| length of T5 (μm) | period of falling edge (μs) | remark |
|---|---|---|
| 4 | 2.6 | selection |
| 4.5 | 2.4 | first step is raised |
| 5 | 2.7 | |
| 5.5 | 13 | two steps are existed in the falling edge |
| 6 | 2.4 | reset delay |

FIG. 5D display device 800 display substrate
810

FIG. 6

DISPLAY SUBSTRATE HAVING GATE DRIVING CIRCUIT AND DISPLAY DEVICE

The application is a U.S. National Phase Entry of International Application PCT/CN2022/077692 filed on Feb. 24, 2022, designating the United States of America and claiming priority to International Patent Application No. PCT/CN2021/097512, filed on May 31, 2021. The present application claims priority to and the benefit of the above-identified applications and the above-identified applications are incorporated by reference herein in their entirety.

TECHNICAL FIELD

Embodiments of the present disclosure relate to a display substrate and a display device.

BACKGROUND

In the technical field of display, for example, a pixel array of a liquid crystal display panel or an Organic Light Emitting Diode (OLED) display panel generally includes a plurality of rows of gate lines and a plurality of columns of data lines intersecting with the plurality of rows of gate lines. The driving of the gate lines may be achieved by a bound integrated driving circuit. In recent years, with the continuous improvement of the preparation technique of amorphous silicon thin film transistors or oxide thin film transistors, the gate line driving circuit can be directly integrated on the thin film transistor array substrate to form a GOA (Gate driver On Array), so as to drive the gate line. For example, the GOA including a plurality of cascaded shift register units may be used to provide a switching state voltage signal (scanning signal) for the plurality of rows of gate lines of the pixel array, so as to control the plurality of rows of gate lines to be sequentially turned on, and the data lines further provide data signals to the pixel units of the corresponding rows in the pixel array, so as to form gray voltages that are required for the gray scales of the display image in the pixel units, thereby displaying a frame of image.

SUMMARY

At least one embodiment of the present disclosure provides a display substrate, which includes: a base substrate; and a gate driving circuit provided on a peripheral region of the base substrate, the gate driving circuit includes a plurality of shift register units that are arranged in a first direction, each shift register unit includes an input circuit, a control circuit, an output circuit and an output noise reduction circuit, the input circuit is connected to an input terminal and configured to control a level of a first node in response to an input signal that is input by the input terminal, the control circuit is connected to the first node, a second node and a third node, the output circuit is connected to the third node and an output terminal, respectively, and is configured to provide an output signal to the output terminal, the output noise reduction circuit is connected to the second node and the output terminal, respectively, and is configured for noise reduction on the output terminal, the control circuit includes a first transistor, a second transistor and a third transistor, a first electrode of the first transistor is connected to the second node and configured to control a level of the second node, a first electrode of the second transistor is connected to the third node, a second electrode of the second transistor is connected to a first voltage line to receive a first voltage, a gate electrode of the second transistor is connected to the first node, and the second transistor is configured to control a level of the third node in response to the level of the first node, a first electrode of the third transistor is connected to the third node and configured to control the level of the third node, and at least two selected from group consisting of an active layer of the first transistor, an active layer of the second transistor and an active layer of the third transistor extend in the first direction and are sequentially arranged in the first direction.

For example, in the display substrate provided in at least one embodiment of the present disclosure, the active layer of the first transistor, the active layer of the second transistor and the active layer of the third transistor extend in the first direction and are sequentially arranged in the first direction.

For example, in the display substrate provided in at least one embodiment of the present disclosure, the control circuit further includes: a fourth transistor and a fifth transistor, a first electrode of the fourth transistor is connected to the first voltage line to receive the first voltage, a second electrode of the fourth transistor is connected to the second node, a gate electrode of the fourth transistor is connected to a first control node, and the fourth transistor is configured to control the level of the second node in response to a level of the first control node; a first electrode of the fifth transistor is connected to the first voltage line to receive the first voltage, a second electrode of the fifth transistor is connected to the second node, a gate electrode of the fifth transistor is connected to a reset signal line, and the fifth transistor is configured to reset the second node; and an active layer of the fourth transistor and an active layer of the fifth transistor extend in the first direction, respectively, and are arranged along a second direction, and the second direction intersects with the first direction.

For example, in the display substrate provided in at least one embodiment of the present disclosure, the active layer of the fifth transistor and the active layer of the second transistor are integrally provided.

For example, in the display substrate provided in at least one embodiment of the present disclosure, in the first direction, the active layer of the fourth transistor and the active layer of the fifth transistor are located between the active layer of the first transistor and the active layer of the second transistor.

For example, in the display substrate provided in at least one embodiment of the present disclosure, the control circuit further includes: a sixth transistor and a seventh transistor, and the input circuit includes an eighth transistor, a gate electrode of the sixth transistor is connected to the first node, a first electrode of the sixth transistor is connected to a first clock signal line to receive a first clock signal, and a second electrode of the sixth transistor is connected to a fourth node; a gate electrode of the seventh transistor is connected to a second clock signal line to receive a second clock signal, a first electrode of the seventh transistor is connected to a second voltage line to receive a second voltage, and a second electrode of the seventh transistor is connected to the fourth node; and an active layer of the seventh transistor and an active layer of the eighth transistor are sequentially arranged in the first direction and extend along the first direction.

For example, in the display substrate provided in at least one embodiment of the present disclosure, an active layer of the sixth transistor is located on a side of the active layer of the seventh transistor and the active layer of the eighth transistor that is away from the first clock signal line, and the active layer of the sixth transistor extends along the first direction.

For example, in the display substrate provided in at least one embodiment of the present disclosure, the control circuit further includes a ninth transistor, a tenth transistor and a first capacitor, a gate electrode of the ninth transistor is connected to the second voltage line, a first electrode of the ninth transistor is connected to the first node, and a second electrode of the ninth transistor is connected to a second control node; a gate electrode of the tenth transistor is connected to the second control node, a first electrode of the tenth transistor is connected to a third clock signal line to receive a third clock signal, and a second electrode of the tenth transistor is connected to a first electrode of the first capacitor; a second electrode of the first capacitor is connected to the second control node; the second control node is connected to a gate electrode of the first transistor, and the gate electrode of the first transistor is connected to a second electrode of the first transistor; and an active layer of the ninth transistor extends along the first direction and is sequentially arranged with the seventh transistor and the eighth transistor in the first direction, and an active layer of the tenth transistor extends along the second direction.

For example, in the display substrate provided in at least one embodiment of the present disclosure, an orthographic projection of the active layer of the ninth transistor on the base substrate, an orthographic projection of the active layer of the eighth transistor on the base substrate, and an orthographic projection of the active layer of the seventh transistor on the base substrate are located on a first side of an orthographic projection of the first capacitor on the base substrate, and are sequentially arranged along the first direction, an orthographic projection of the active layer of the first transistor on the base substrate is located on a second side of the first capacitor on the base substrate, the first side of the first capacitor on the base substrate is a side of the first capacitor that is close to the first clock signal line on the base substrate, the second side of the first capacitor on the base substrate is a side of the first capacitor that is away from the first clock signal line on the base substrate, and the orthographic projection of the first capacitor on the base substrate is located between the ninth transistor and the tenth transistor in the first direction; or the first capacitor includes an extension portion that is close to the first clock signal line, and in the first direction, an orthographic projection of the extension portion on the base substrate is located between an orthographic projection of the tenth transistor on the base substrate and an orthographic projection of the ninth transistor on the base substrate, and the first transistor is located on the side of the first capacitor that is away from the first clock signal line on the base substrate.

For example, in the display substrate provided in at least one embodiment of the present disclosure, the tenth transistor is connected to the first electrode of the first capacitor through a first via hole and a second via hole, and an orthographic projection of the first via hole and an orthographic projection of the second via hole on the base substrate are within the orthographic projection of the first capacitor on the base substrate.

For example, in the display substrate provided in at least one embodiment of the present disclosure, the control circuit further includes an eleventh transistor, a twelfth transistor and a second capacitor, a gate electrode of the eleventh transistor is connected to the second voltage line, a first electrode of the eleventh transistor is connected to the fourth node, and a second electrode of the eleventh transistor is connected to a third control node; a gate electrode of the twelfth transistor is connected to the third control node, a first electrode of the twelfth transistor is connected to a fourth clock signal line to receive a fourth clock signal, and a second electrode of the twelfth transistor is connected to a first electrode of the second capacitor; a second electrode of the second capacitor is connected to the first control node; and an active layer of the eleventh transistor extends along the first direction and is sequentially arranged with the active layer of the sixth transistor in the first direction, and the active layer of the ninth transistor and the active layer of the eleventh transistor are sequentially arranged in the second direction.

For example, in the display substrate provided in at least one embodiment of the present disclosure, an active layer of the twelfth transistor extends along the second direction, and in the second direction, an orthographic projection of the active layer of the twelfth transistor on the base substrate and an orthographic projection of the second capacitor on the base substrate are located between an orthographic projection of the active layer of the sixth transistor on the base substrate and an orthographic projection of the active layer of the third transistor on the base substrate, the orthographic projection of the active layer of the twelfth transistor on the base substrate is located on a side of the orthographic projection of the second capacitor on the base substrate that is away from the first capacitor, and in the second direction, the active layer of the third transistor is located on a side of the twelfth transistor that is away from the second capacitor; or the active layer of the twelfth transistor extends along the second direction, and the orthographic projection of the active layer of the twelfth transistor on the base substrate and the orthographic projection of the active layer of the sixth transistor on the base substrate are located on a side of the orthographic projection of the second capacitor on the base substrate that is close to the orthographic projection of the first capacitor on the base substrate.

For example, in the display substrate provided in at least one embodiment of the present disclosure, a width-to-length ratio of a channel of the tenth transistor is greater than 1.75.

For example, in the display substrate provided in at least one embodiment of the present disclosure, a width-to-length ratio of a channel of the first transistor is greater than 2.

For example, in the display substrate provided in at least one embodiment of the present disclosure, the width-to-length ratio of the channel of the first transistor is 3.

For example, in the display substrate provided in at least one embodiment of the present disclosure, the active layer of the first transistor is connected to the first electrode of the first transistor through a third via hole, and an orthographic projection of a channel of the first transistor on the base substrate does not overlap with an orthographic projection of the third via hole on the base substrate.

At least one embodiment of the present disclosure provides a display device, which includes the display substrate provided by any embodiment of the present disclosure.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

FIG. 5C shows a schematic diagram of a change in an output signal of a shift register following a width change of a first transistor provided by at least one embodiment of the present disclosure;

FIG. 5D shows a schematic diagram of a change in an output signal of a shift register following a length change of a first transistor provided by at least one embodiment of the present disclosure; and FIG. 6 is a schematic block diagram of a display device provided by at least one embodiment of the present disclosure.

DETAILED DESCRIPTION

In order to make objects, technical details and advantages of the embodiments of the present disclosure, the technical solutions of the embodiments will be described in a clearly and fully understandable way in connection with the drawings related to the embodiments of the present disclosure. Apparently, the described embodiments are just a part but not all of the embodiments of the present disclosure. Based on the described embodiments herein, those skilled in the art can obtain other embodiment(s), without any inventive work, which should be within the scope of the present disclosure.

Unless otherwise defined, all the technical and scientific terms used herein have the same meanings as commonly understood by one of ordinary skill in the art to which the present disclosure belongs. The terms "first," "second," etc., which are used in the present disclosure, are not intended to indicate any sequence, amount or importance, but distinguish various components. Likewise, the terms "a", "an", "one" or "the" etc., do not denote a limitation of quantity, but mean that there is at least one. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

Figures 1A, 1B:
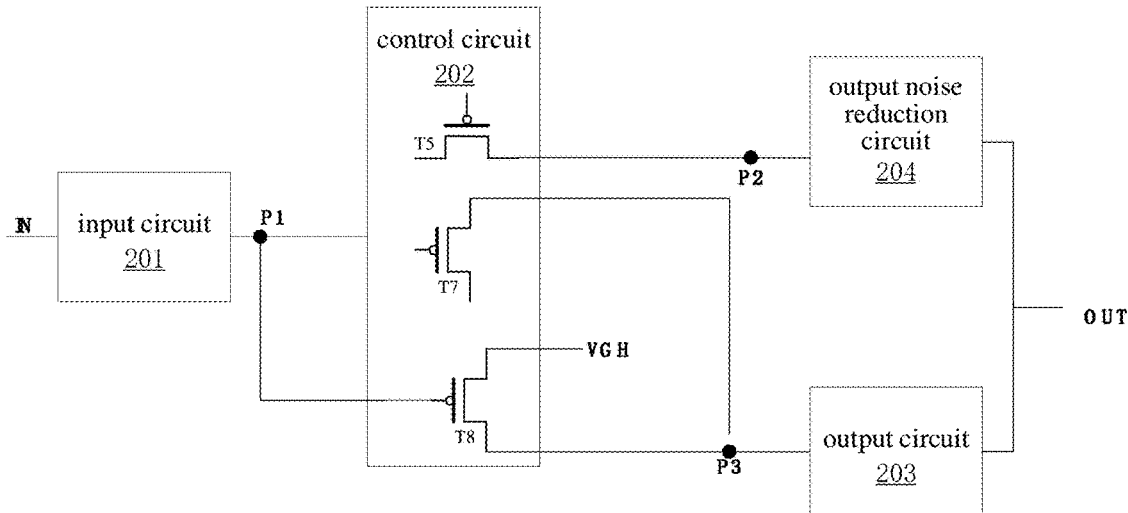
FIG. 1A is a schematic diagram of an overall circuit architecture of a display panel.
FIG. 1B shows a schematic diagram of a shift register unit provided by at least one embodiment of the present disclosure.

FIG. 1A is a schematic diagram of an overall circuit architecture of a display panel. For example, as shown in FIG. A, the rectangular frame pointed by drawing numeral 101 represents the overall outer frame line of the display panel. The display panel 101 includes a display region (that is, a pixel array region) 102 and a peripheral region 106 located at the periphery of the display region 102, and the display region 102 includes pixel units 103 that are arranged in an array. The peripheral region 106 includes a plurality of shift register units 104. The plurality of cascaded shift register units 104 form a gate driving circuit (Gate GOA), and is configured to provide, for example, gate scanning signals shifted row by row to pixel units 103 that are arranged in an array in the display region 102 of the display panel 101. The plurality of shift register units of the gate driving circuit are sequentially arranged in a first direction (for example, the Y direction in FIG. 1A). The peripheral region 106 further includes light-emitting control register units 105. The plurality of cascaded light-emitting control register units 105 form a light-emitting control driving circuit array (EM GOA), and is configured to provide, for example, a shift light-emitting control signal shifted row-by-row to the pixel units 103 that are arranged in an array in the display region 102 of the display panel 101.

In some embodiments, the output signal that is output by the output circuit of one shift register unit 104 is correspondingly output to the two rows of pixel units 103, and the embodiments of the present disclosure include but are not limited to this.

As shown in FIG. 1A, data lines DL1-DLN (N is an integer greater than 1) that are connected to the data driving chip IC longitudinally pass through the display region 102 to provide data signals for the pixel units 103 that are arranged in an array. The gate lines GL1-GLM (M is an integer greater than 1) that are connected to the shift register unit 104 and the light-emitting control register unit 105 transversely pass through the display region 102 to provide a gate scanning signal and a light-emitting control signal for the pixel units 103 that are arranged in an array. For example, each pixel unit 103 may include a pixel circuit with circuit structures such as 7 T1C, 8 T2C, or 4 T1C in the art and a light-emitting element, and the pixel circuit operates under the control of a data signal transmitted through a data line, a gate scanning signal transmitted by a gate line and a light-emitting control signal, so as to drive the light-emitting element to emit light, thereby achieving operations such as display. The light-emitting element may be, for example, an organic light emitting diode (OLED) or a quantum dot light emitting diode (QLED).

As shown in FIG. 1A, the gate driving circuit and the light-emitting control driving circuit array have a large influence on the size of the peripheral region of the display panel. If the layout wiring of the gate driving circuit or the layout wiring of the light-emitting control driving circuit is unreasonable, the peripheral region of the display panel is large, and the narrow frame is difficult to realize.

At least one embodiment of the present disclosure provides a display substrate and a display device. The display substrate includes a base substrate and a gate driving circuit provided on a peripheral region of the base substrate. The gate driving circuit includes a plurality of shift register units that are arranged in a first direction, and each shift register unit includes an input circuit, a control circuit, an output circuit and an output noise reduction circuit. The input circuit is connected to an input terminal and configured to control a level of a first node in response to an input signal that is input by the input terminal. The control circuit is connected to the first node, a second node and a third node. The output circuit is connected to the third node and an output terminal, respectively, and is configured to provide an output signal to the output terminal. The output noise reduction circuit is connected to the second node and the output terminal, respectively, and is configured for noise reduction on the output terminal. The control circuit includes a first transistor, a second transistor and a third transistor. A first electrode of the first transistor is connected to the second node and configured to control a level of the second node. A first electrode of the second transistor is connected to the third node, a second electrode of the second transistor is connected to a first voltage line to receive a first voltage, a gate electrode of the second transistor is connected to the first node, and the second transistor is configured to control a level of the third node in response to the level of the first node. A first electrode of the third transistor is connected to the third node and configured to control the level of the third node. At least two selected from group consisting of an active layer of the first transistor, an active layer of the second transistor and an active layer of the third transistor extend in the first direction and are sequentially arranged in the first direction. The display device can improve the density of the gate driving circuit layout, thereby reducing the size of the peripheral region and facilitating the realization of a narrow frame.

FIG. 1B shows a schematic diagram of a shift register unit provided by at least one embodiment of the present disclosure.

As shown in FIG. 1B, the shift register unit 200 includes an input circuit 201, a control circuit 202, an output circuit 203, and an output noise reduction circuit 204. The circuit structure of the shift register unit 104 that is described above in FIG. 1A, for example, may be the same as the circuit structure of the shift register unit 200.

The input circuit 201 is connected to an input terminal IN and configured to control a level of a first node P1 in response to an input signal input by the input terminal IN.

The control circuit 202 is connected to the first node P1, a second node P2 and a third node P3.

The output circuit 203 is respectively connected to the third node P3 and an output terminal OUT, and the output circuit 203 is configured to provide an output signal to the output terminal OUT.

The output noise reduction circuit 204 is connected to the second node P2 and the output terminal OUT, respectively, and the output noise reduction circuit 204 is configured for noise reduction on the output terminal OUT.

The control circuit includes a first transistor T5, a second transistor T8 and a third transistor T7. A first electrode of the first transistor T5 is connected to the second node P2 and configured to control a level of the second node P2. A first electrode of the second transistor T8 is connected to the third node P3, a second electrode of the second transistor T8 is connected to a first voltage line VGH to receive a first voltage, a gate electrode of the second transistor T8 is connected to the first node P1, and the second transistor T8 is configured to control a level of the third node P3 in response to the level of the first node P1, A first electrode of the third transistor T7 is connected to the third node P3 and configured to control the level of the third node P3.

At least two selected from group consisting of an active layer of the first transistor T5, an active layer of the second transistor T8 and an active layer of the third transistor T7 extend in the first direction and are sequentially arranged in the first direction.

In some embodiments of the present disclosure, the active layer of the first transistor T5, the active layer of the second transistor T8 and the active layer of the third transistor T7 all extend in the first direction and are sequentially arranged in the first direction.

At least two selected from group consisting of the active layer of the first transistor T5, the active layer of the second transistor T8, and the active layer of the third transistor T7 extend in the first direction and are sequentially arranged in the first direction, so that a plurality of transistors are regularly arranged, and the density of the gate driving circuit layout is improved, thereby reducing the size of the peripheral region and facilitating the realization of a narrow frame.

Figure 1C:
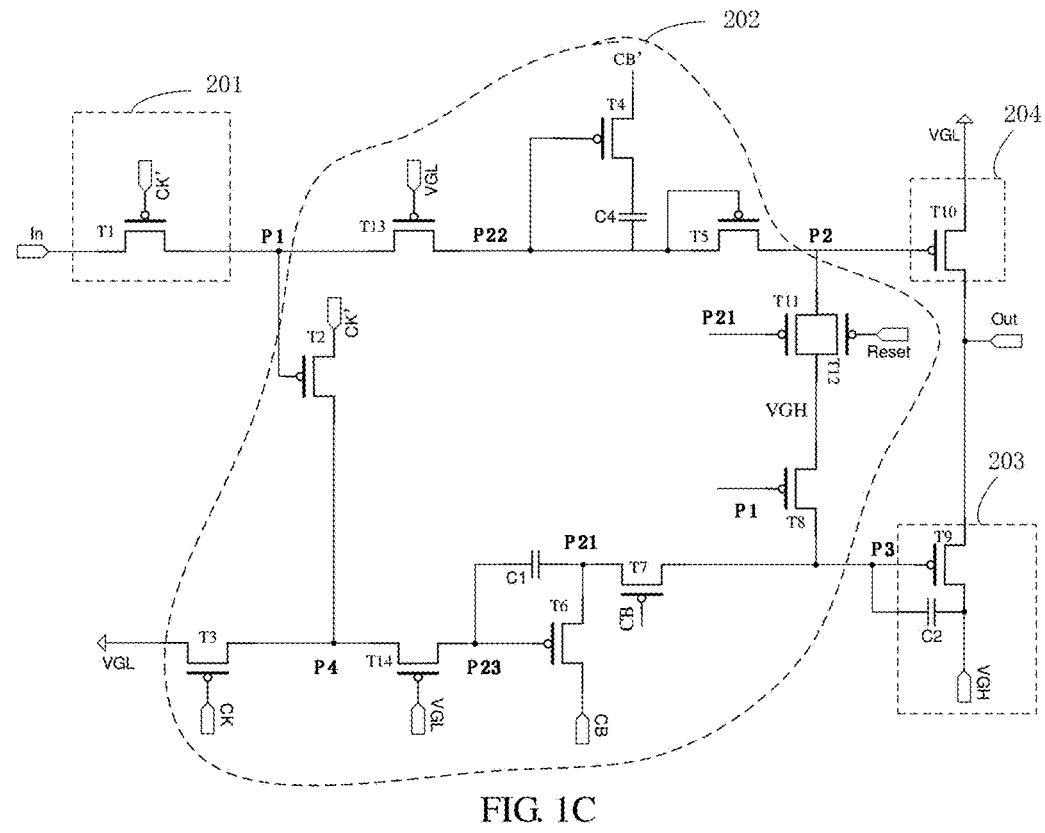
FIG. 1C shows a circuit diagram of a shift register unit provided by at least one embodiment of the present disclosure.

FIG. 1C shows a circuit diagram of a shift register unit provided by at least one embodiment of the present disclosure.

As shown in FIG. 1C, the control circuit includes a first transistor T5, a second transistor T8 and a third transistor T7. The connection relationship between the first transistor T5, the second transistor T8, and the third transistor T7 is described above, which is not repeated here.

As shown in FIG. 1C, the input circuit 201 may include an eighth transistor T1, the output circuit 203 may include a thirteenth transistor T9, and the output noise reduction circuit 204 may include a fourteenth transistor T10.

A gate electrode of the eighth transistor T1 is connected to the first clock signal line to receive the first clock signal, the first clock signal line is, for example, a clock signal line CK', and the first clock signal is, for example, a clock signal CK' that is provided by the clock signal line CK'. A first electrode of the eighth transistor T1 is connected to the input terminal IN, and a second electrode of the eighth transistor T1 is connected to the first node P1. It should be understood that, in the present disclosure, the clock signal line and the clock signal are represented by the same symbol. For example, CK' represents the first clock signal, and CK' also represents the first clock signal line.

A gate electrode of the thirteenth transistor T9 is connected to the third node P3, a first electrode of the thirteenth transistor T9 is connected to the output terminal OUT, and a second electrode of the thirteenth transistor T9 is connected to the first voltage line VGH.

A gate electrode of the fourteenth transistor T10 is connected to the second node P2, a first electrode of the fourteenth transistor T10 is connected to the output terminal OUT, and a second electrode of the fourteenth transistor T10 is connected to the second voltage line VGL.

As shown in FIG. 1C, a gate electrode of the seventh transistor T3 is connected to a second clock signal line, and the clock signal line CK is an example of the second clock signal line. A first electrode of the tenth transistor T4 is connected to a third clock signal line, and a clock signal line CB' is an example of the third clock signal line. A first electrode of T6 is connected to a fourth clock signal line, and a clock signal line CB is an example of the fourth clock signal line.

Figure 2A:
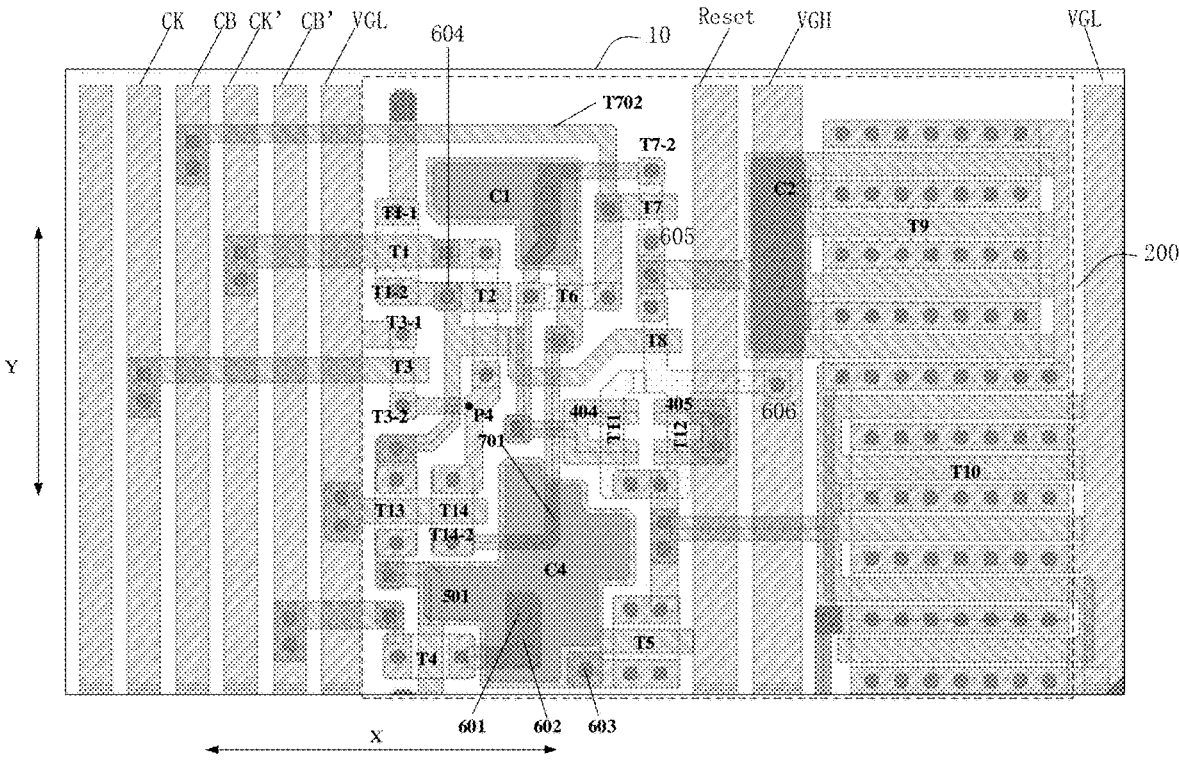
FIG. 2A shows a schematic layout diagram of the shift register unit shown in FIG. 1C on a display substrate provided by at least one embodiment of the present disclosure.
Figure 3A:
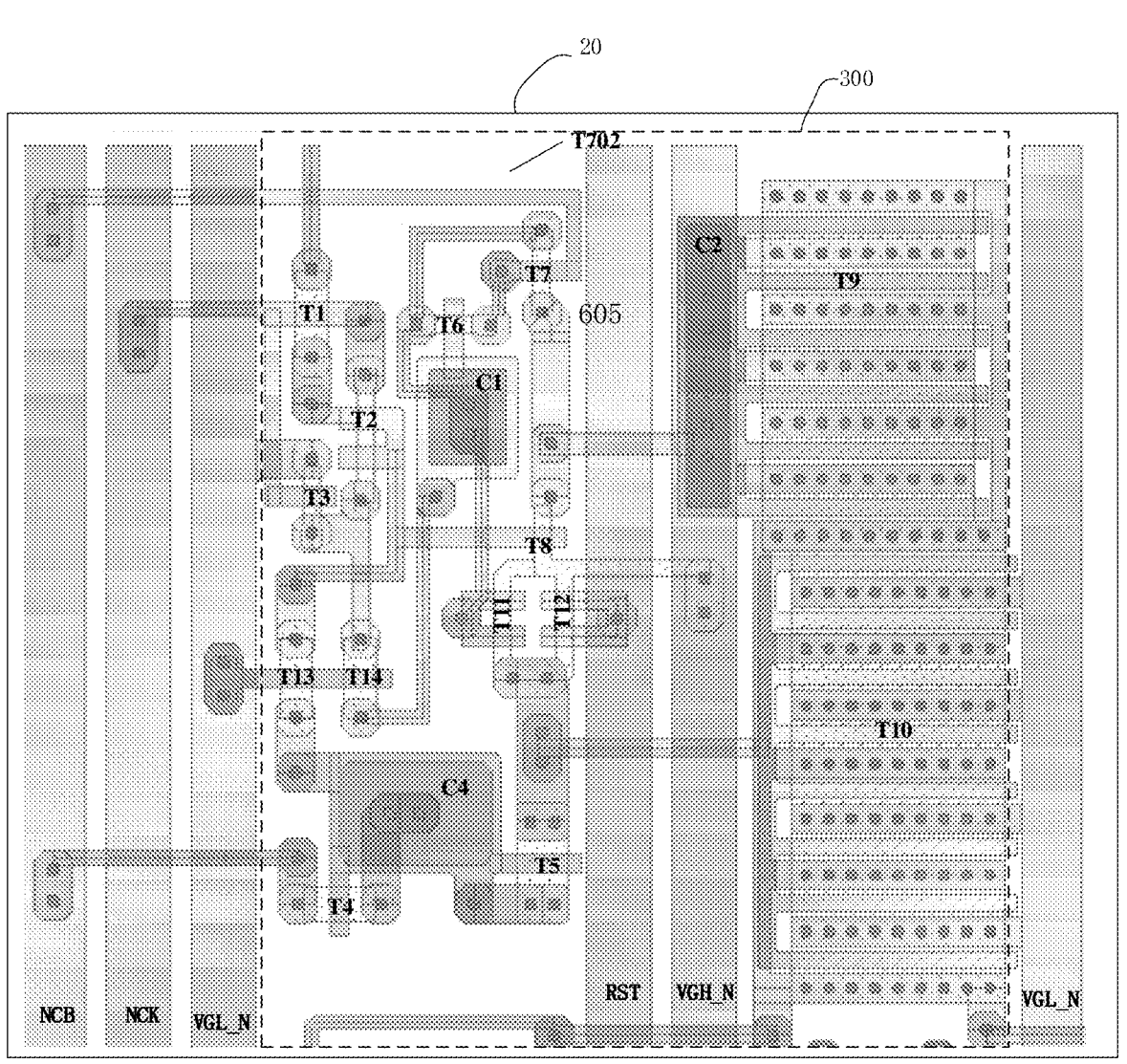
FIG. 3A shows another schematic layout diagram of the shift register unit shown in FIG. 1C on a display substrate provided by at least one embodiment of the present disclosure.

The second clock signal line and the first clock signal line may be the same signal line or different signal lines, and the third clock signal line and the fourth clock signal line may be the same signal line or different signal lines. As shown in FIG. 2A, the first clock signal line and the second clock signal line are different signal lines, the third clock signal line and the fourth clock signal line are different signal lines, that is, the clock signal line CK' is an example of the first clock signal line, the clock signal line CK is an example of the second clock signal line, the clock signal line CB' is an example of the third clock signal line, and the clock signal line CB is an example of the fourth clock signal line. FIG. 3A is an embodiment that the second clock signal line and the first clock signal line are the same signal line, and the third clock signal line and the fourth clock signal line are the same signal line, that is, the clock signal line NCK is an example of the first clock signal line and the second clock signal line, and the clock signal line NCB is an example of the third clock signal line and the fourth clock signal line.

Figure 2B:
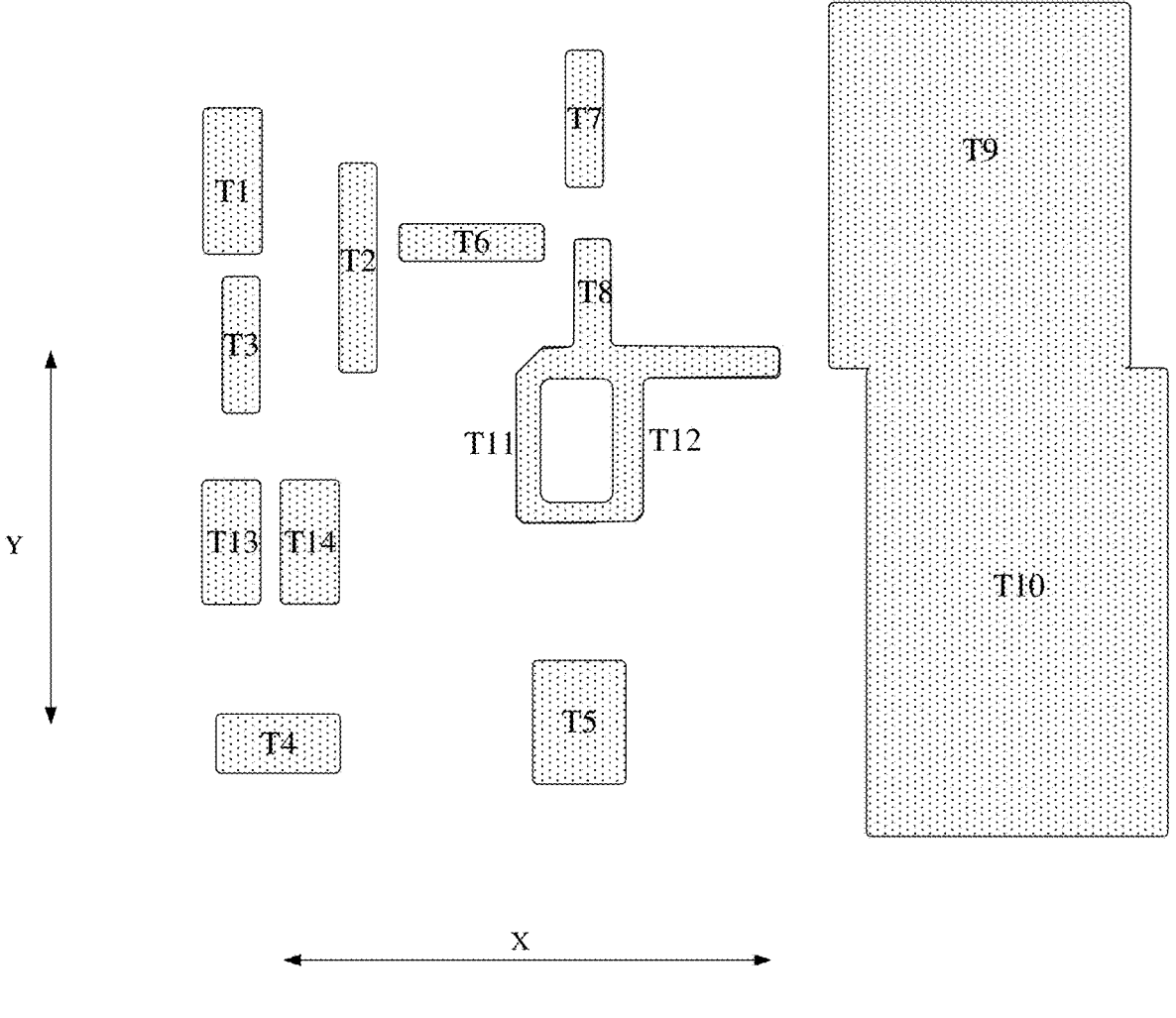
FIG. 2B shows a plan view of an active layer of the display substrate in FIG. 2A provided by at least one embodiment of the present disclosure.

With reference to FIG. 2A and FIG. 2B, the active layer of the first transistor T5, the active layer of the second transistor T8, the active layer of the third transistor T7, and the plurality of embodiments provided in the present disclosure are described.

FIG. 2A shows a schematic layout diagram of the shift register unit shown in FIG. 1C on a display substrate provided by at least one embodiment of the present disclosure.

Figure 2C:
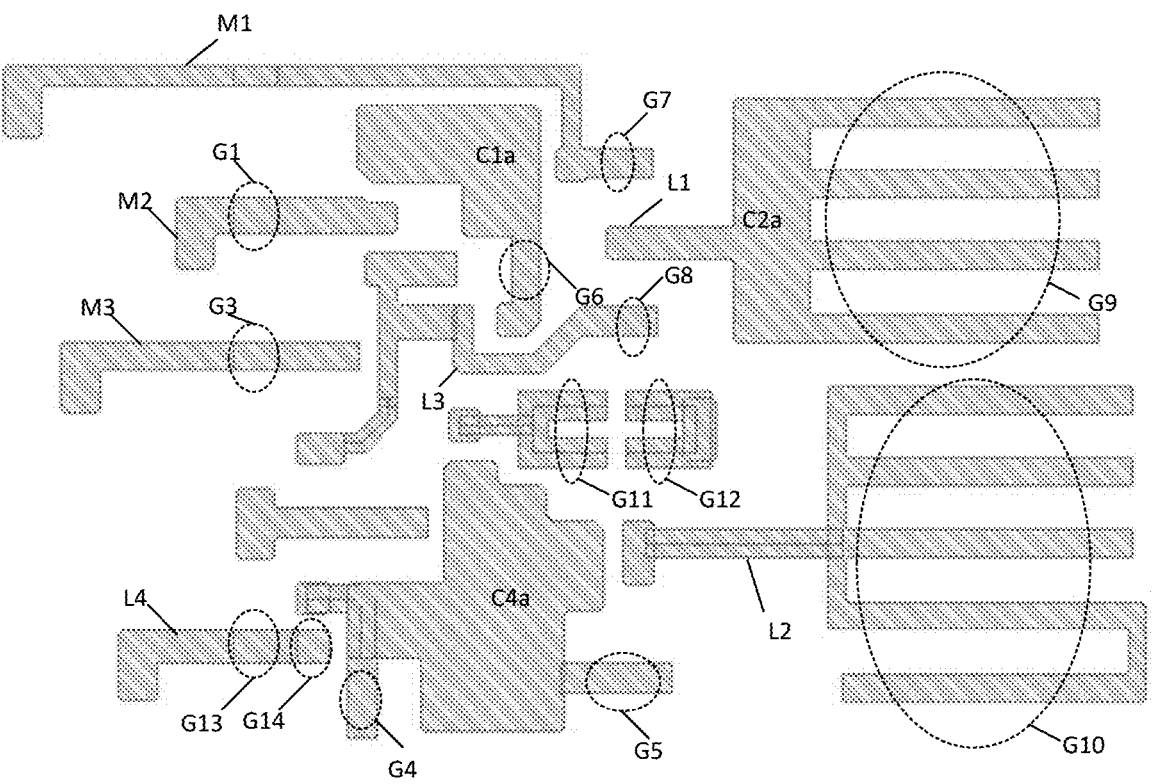
FIG. 2C shows a plan view of a first conductive layer of the display substrate in FIG. 2A provided by at least one embodiment of the present disclosure.
Figure 2D:
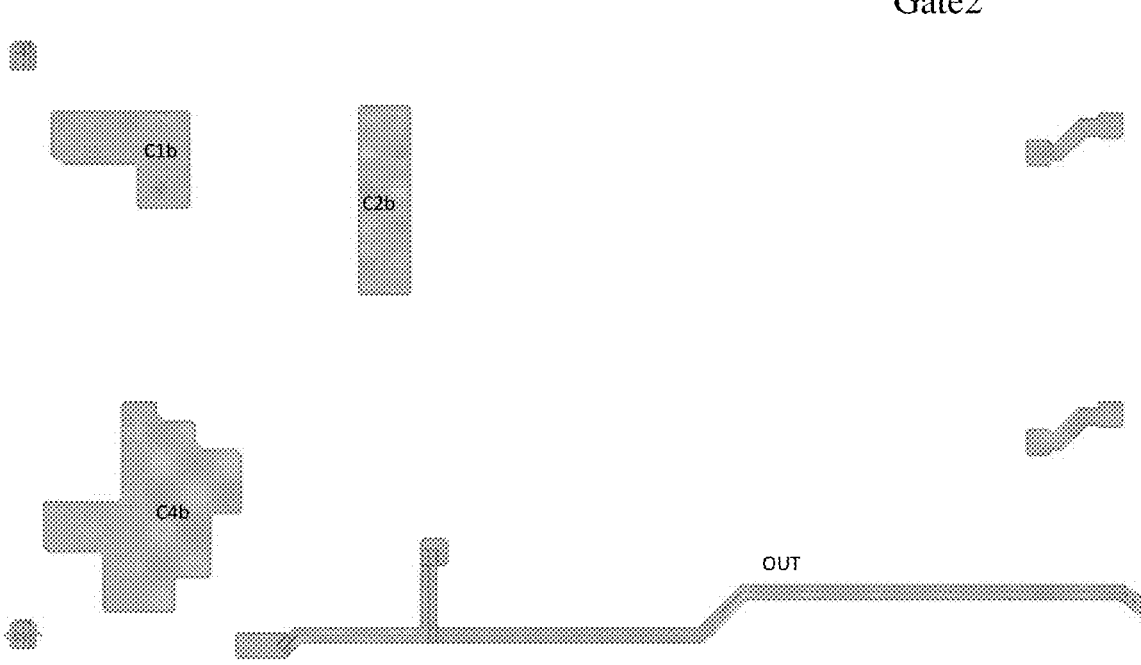
FIG. 2D shows a plan view of a second conductive layer of the display substrate in FIG. 2A provided by at least one embodiment of the present disclosure.
Figure 2E:
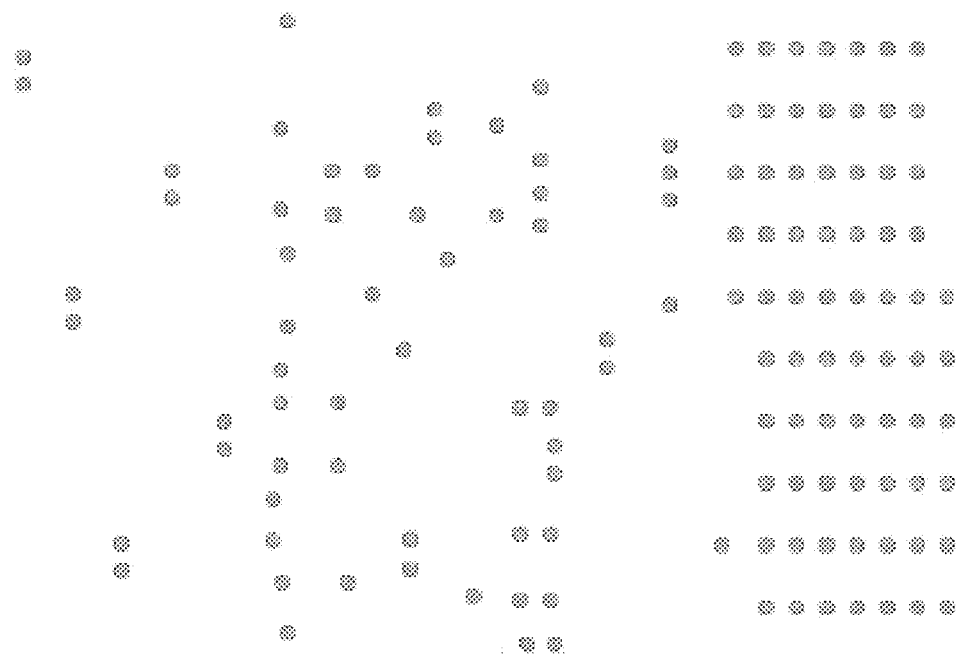
FIG. 2E shows a via holes distribution diagram of a second insulating layer of the display substrate in FIG. 2A provided by at least one embodiment of the present disclosure.
Figure 2F:
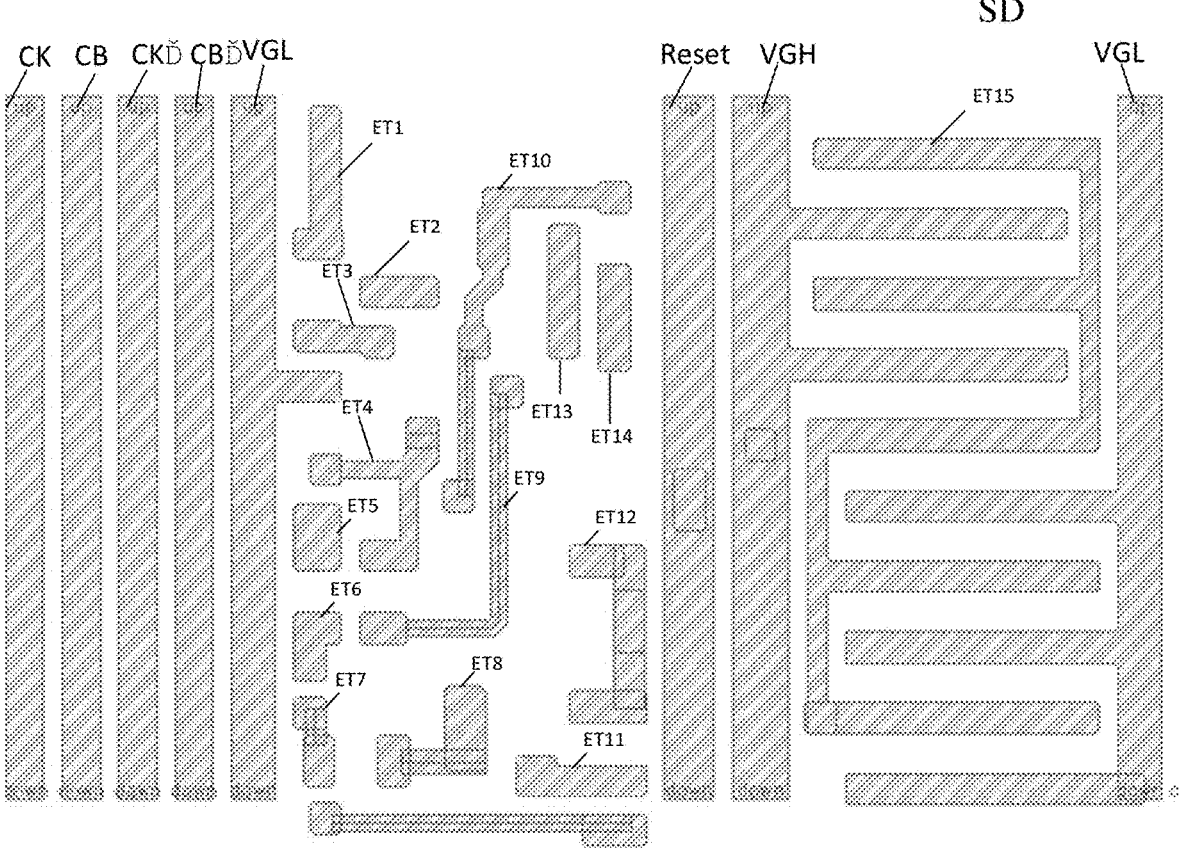
FIG. 2F shows a plan view of a third conductive layer of the display substrate in FIG. 2A provided by at least one embodiment of the present disclosure.

FIG. 2B shows a plan view of an active layer of the display substrate in FIG. 2A provided by at least one embodiment of the present disclosure. FIG. 2C shows a plan view of a first conductive layer of the display substrate in FIG. 2A provided by at least one embodiment of the present disclosure. FIG. 2D shows a plan view of a second conductive layer of the display substrate in FIG. 2A provided by at least one embodiment of the present disclosure. FIG. 2E shows a via hole distribution diagram of a second insulating layer of the display substrate in FIG. 2A provided by at least one embodiment of the present disclosure. FIG. 2F shows a plan view of a third conductive layer of the display substrate in FIG. 2A provided by at least one embodiment of the present disclosure.

As shown in FIG. 2A, the display substrate includes a base substrate 10 as well as a shift register unit 200, a first voltage line VGH, a second voltage line VGL and a plurality of clock signal lines that are provided on the base substrate 10. For example, a plurality of clock signal lines include the clock signal line CK', the clock signal line CK, the clock signal line CB', and the clock signal line CB that are shown in FIG. 1C, and may further include a trigger signal line (not shown in the FIG. 2A).

As shown in FIGS. 2A and 2B, an orthographic projection of the active layer of the first transistor T5 on the base substrate, an orthographic projection of the active layer of the second transistor T8 on the base substrate, and an orthographic projection of the active layer of the third transistor T7 on the base substrate all extend in the first direction Y and are sequentially arranged in the first direction Y. The first direction Y is a direction in which the plurality of shift register units are sequentially arranged on the base substrate.

For example, the central axes of the active layer of the first transistor T5, the active layer of the second transistor T8, and the active layer of the third transistor T7 in the extending direction are located on the same straight line or approximately in the same straight line.

As shown in FIG. 1C, in some embodiments of the present disclosure, the control circuit 202 further includes a fourth transistor T11 and a fifth transistor T12 in addition to the first transistor T5, the second transistor T8, and the third transistor T7.

A first electrode of the fourth transistor T11 is connected to the first voltage line VGH to receive the first voltage VGH, a second electrode of the fourth transistor T11 is connected to the second node, a gate electrode of the fourth transistor T11 is connected to the first control node P21, and the fourth transistor T11 is configured to control the level of the second node P2 in response to the level of the first control node P21.

A first electrode of the fifth transistor T12 is connected to the first voltage line VGH to receive the first voltage VGH, a second electrode of the fifth transistor T12 is connected to the second node P2, a gate electrode of the fifth transistor T12 is connected to the reset signal line Reset, and the fifth transistor T12 is configured to reset the second node P2.

In some embodiments of the present disclosure, an active layer of the fourth transistor T11 and an active layer of the fifth transistor T12 extend in the first direction Y, respectively, and are arranged along the second direction X, and the second direction X intersects with the first direction Y.

For example, as shown in FIG. 2A and FIG. 2B, the second direction X is perpendicular to the first direction Y, the active layer of the fourth transistor T11 and the active layer of the fifth transistor T12 extend along the first direction Y, respectively, and the active layer of the fourth transistor T11 and the active layer of the fifth transistor T12 are arranged in the second direction X.

In some embodiments of the present disclosure, as shown in FIG. 2A and FIG. 2B, the active layer of the fifth transistor T12 and the active layer of the second transistor T8 are integrally provided.

In some other embodiments of the present disclosure, the active layer of the fourth transistor T11, the active layer of the fifth transistor T12, and the active layer of the second transistor T8 are integrally provided.

In some embodiments of the present disclosure, as shown in FIG. 2A and FIG. 2B, in the first direction Y, the active layer of the fourth transistor T11 and the active layer of the fifth transistor T12 are located between the active layer of the first transistor T5 and the active layer of the second transistor T8.

In some embodiments of the present disclosure, a side of the active layer of each transistor that is away from the base substrate 10 includes a conductive layer of each transistor. For example, as shown in FIG. 2A, the conductive layer 404 of the fourth transistor T11 and the conductive layer 405 of the fifth transistor T12 are provided opposite to each other, for example, the conductive layer 404 of the fourth transistor T11 and the conductive layer 405 of the fifth transistor T12 are mirror symmetrical. An overlapping portion of the conductive layer 404 of the fourth transistor T11 and the active layer of the fourth transistor T11 forms a channel of the fourth transistor T11. The overlapping portion of the conductive layer 405 of the fifth transistor T12 and the active layer of the fifth transistor T12 forms a channel of the fifth transistor T12.

As shown in FIG. 1C, the control circuit 202 may further include a sixth transistor T2 and a seventh transistor T3. A gate electrode of the sixth transistor T2 is connected to the first node P1, a first electrode of the sixth transistor T2 is connected to the clock signal line CK' to receive the clock signal CK', and a second electrode of the sixth transistor T2 is connected to the fourth node P4.

A gate electrode of the seventh transistor T3 is connected to the clock signal line CK to receive the clock signal CK, a first electrode of the seventh transistor T3 is connected to the second voltage line VGL to receive a second voltage VGL, and a second electrode of the seventh transistor T3 is connected to the fourth node P4. An active layer of the seventh transistor T3 and an active layer of the eighth transistor T1 are sequentially arranged in the first direction Y and extend along the first direction Y.

As shown in FIG. 2A and FIG. 2B, the active layer of the seventh transistor T3 and the active layer of the eighth transistor T1 are sequentially arranged in the first direction Y and extend along the first direction Y.

In some embodiments of the present disclosure, an active layer of the sixth transistor T2 is located on a side of the active layer of the seventh transistor T3 and the active layer of the eighth transistor that is away from the first clock signal line CK', and the active layer of the sixth transistor T2 extends along the first direction Y. The active layer of the sixth transistor T2 is located on the side of the active layer of the seventh transistor T3 and the active layer of the eighth transistor T1 that is away from the clock signal line CK', which can facilitate the connection of the sixth transistor T2 with the seventh transistor T3 and the eighth transistor T1, respectively, and avoid excessive wire windings. For example, as shown in FIG. 2A and FIG. 2B, the first electrode of the sixth transistor T2 is provided close to the eighth transistor T1, and the second electrode of the sixth transistor T2 is close to the seventh transistor T3, thereby reducing the wire windings between the first electrode of the sixth transistor T2 and the eighth transistor T1 and the wire windings between the second electrode of the sixth transistor T2 and the seventh transistor T3, benefiting to saving wiring space and improving the compactness of the display substrate.

As shown in FIG. 1C, the control circuit 202 may further include a ninth transistor T13, a tenth transistor T4, and a first capacitor C4.

The gate electrode of the ninth transistor T13 is connected to the second voltage line VGL, a first electrode of the ninth transistor T13 is connected to the first node P1, and a second electrode of the ninth transistor T13 is connected to the second control node P22.

A gate electrode of the tenth transistor T4 is connected to the second control node P22, a first electrode of the tenth transistor T4 is connected to the clock signal line CB' to receive the clock signal CB', and a second electrode of the tenth transistor T4 is connected to a first electrode of the first capacitor C4. A second electrode of the first capacitor C4 is connected to the second control node P22. The second control node P22 is connected to the gate electrode of the first transistor T5, and the gate electrode of the first transistor T5 is connected to a second electrode of the first transistor T5. An active layer of the ninth transistor T13 extends along the first direction Y and is sequentially arranged with the seventh transistor T3 and the eighth transistor T1 in the first direction Y. An active layer of the tenth transistor T4 extends along the second direction X.

For example, as shown in FIG. 2A and FIG. 2B, the ninth transistor T13, the seventh transistor T3, and the eighth transistor T1 are sequentially arranged along the first direction Y; the ninth transistor T13, the seventh transistor T3, and the eighth transistor T1 are closer to a plurality of clock signal lines relative to other transistors.

In some embodiments of the present disclosure, as shown in FIG. 2A and FIG. 2B, the first capacitor C4 includes an extension portion 501 close to the clock signal line CK', and in the first direction Y, an orthographic projection of the extension portion 501 on the base substrate is located between an orthographic projection of the tenth transistor T4 on the base substrate and an orthographic projection of the ninth transistor T13 on the base substrate. The first transistor T5 is located on a side of the first capacitor C4 that is away from the clock signal line CK' on the base substrate. The arrangement can increase the area of the first capacitor C4 to reduce the output noise while improving the compactness of the display substrate layout.

For example, the tenth transistor T4 is connected to the first electrode C41 of the first capacitor C4 through a first via hole 601 and a second via hole 602, and an orthographic projection of the first via hole and an orthographic projection of the second via hole on the base substrate are within the orthographic projection of the first capacitor on the base substrate, which can save the layout space of the display substrate and more facilitate to achieve a narrow frame. For example, a direction of heights of the first via hole 601 and the second via hole 602 is perpendicular to the display substrate 10. For example, the second via hole 602 is close to the base substrate 10 relative to the first via hole 601, and the orthographic projection of the second via hole 602 on the base substrate 10 does not overlap with the orthographic projection of the first via hole 601 on the base substrate 10.

As shown in FIG. 1C, the control circuit 202 further includes an eleventh transistor T14, a twelfth transistor T6 and a second capacitor C1.

A gate electrode of the eleventh transistor T14 is connected to the second voltage line VGL, a first electrode of the eleventh transistor T14 is connected to the fourth node, and a second electrode of the eleventh transistor T14 is connected to a third control node P23. A gate electrode of the twelfth transistor T6 is connected to the third control node P23, a first electrode of the twelfth transistor T6 is connected to the clock signal line CB to receive the clock signal CB, and a second electrode of the twelfth transistor T6 is connected to a first electrode of the second capacitor C1. A second electrode of the second capacitor C1 is connected to the first control node P21.

As shown in FIG. 2A and FIG. 2B, an active layer of the eleventh transistor T14 extends along the first direction Y and is sequentially arranged with the active layer of the sixth transistor T2 in the first direction. The active layer of the ninth transistor and the active layer of the eleventh transistor are sequentially arranged in the second direction X. The orthographic projection of the tenth transistor T4 on the base substrate and the orthographic projection of the eleventh transistor T14 on the base substrate are located on two sides of the orthographic projection of the extension portion 501 on the base substrate.

In some embodiments of the present disclosure, the active layer of the eleventh transistor T14 and the active layer of the sixth transistor T2 are sequentially arranged in the first direction including that the active layer of the eleventh transistor T14 and the active layer of the sixth transistor T2 are arranged in a straight line in the first direction. For example, the active layer of the eleventh transistor T14 and the active layer of the sixth transistor T2 are rectangular patterns, and the center line of the rectangular pattern of the active layer of the eleventh transistor T14 overlaps with the center line of the rectangular pattern of the active layer of the sixth transistor T2.

In some embodiments of the present disclosure, an active layer of the twelfth transistor T6 extends along the second direction X, and an orthographic projection of the active layer of the twelfth transistor T6 on the base substrate and an orthographic projection of the active layer of the sixth transistor T2 on the base substrate are located on a side of an orthographic projection of the second capacitor C1 on the base substrate that is close to the orthographic projection of the first capacitor C4 on the base substrate. That is, the orthographic projection of the active layer of the twelfth transistor T6 on the base substrate and the orthographic projection of the active layer of the sixth transistor T2 on the base substrate are located between the orthographic projection of the second capacitor C1 on the base substrate and the orthographic projection of the first capacitor C4 on the base substrate.

In some embodiments of the present disclosure, the active layer of the first transistor T5 is connected to the first electrode of the first transistor T5 through a third via hole 603, and an orthographic projection of a channel of the first transistor T5 on the base substrate does not overlap with an orthographic projection of the third via hole 603 on the base substrate.

As shown in FIG. 2A, an overlapping portion of the active layer and the conductive layer of the eighth transistor forms a channel of the eighth transistor, that is, the overlapping portion of the active layer and the conductive layer of the eighth transistor is the gate electrode of the eighth transistor. The gate electrode of the eighth transistor is connected to the clock signal line CK', the second electrode T1-1 of the eighth transistor is connected to the input terminal, and the second electrode T1-2 of the eighth transistor is connected to the gate electrode of the sixth transistor T2 through a fourth via hole 604. An overlapping portion of the active layer and the conductive layer of the sixth transistor T2 is used as the gate electrode of the sixth transistor T2, and the first electrode of the sixth transistor T2 is connected to the clock signal line CK'. As shown in FIG. 2A, the second electrode of the sixth transistor T2 and the second electrode of the seventh transistor T3 are both connected to the first electrode of the eleventh transistor T14. For example, a second electrode of the sixth transistor T2, a second electrode T3-2 of the seventh transistor T3, and the first electrode of the eleventh transistor T14 are all connected to P4. An overlapping portion of the active layer and the conductive layer of the seventh transistor T3 is used as the gate electrode of the seventh transistor, and the gate electrode of the seventh transistor T3 is connected to the clock signal line CK'. The first electrode of the seventh transistor T3 is connected to the T3-1 and the second voltage line VGL.

As shown in FIG. 2A, an overlapping portion of the active layer and the conductive layer of the eleventh transistor T14 is used as the gate electrode of the eleventh transistor T14, an overlapping portion of the active layer and the conductive layer of the ninth transistor T13 is used as the gate electrode of the ninth transistor T13, and the gate electrode of the eleventh transistor T14 and the gate electrode of the ninth transistor are both connected to the second voltage line VGL. The second electrode T14-2 of the eleventh transistor T14 is connected to the second capacitor C1 through a wire 701. As shown in FIG. 2A, an orthogonal projection of the wire 701 on the base substrate 10 and an orthogonal projection of the first capacitor C4 on the base substrate partially overlap, and the wire 701 and the first capacitor C4 are located at different heights in the direction that is perpendicular to the base substrate. The second electrode T7-2 of the third transistor T7 is connected to a first electrode plate of the second capacitor C1, and the gate electrode of the third transistor T7 is connected to the clock signal line CB through the wire 702. The first electrode T7-1 of the third transistor T7 and the first electrode of the second transistor T8 are connected through a fifth via hole 605. The second electrode of the second transistor T8 is connected through a sixth via hole 606.

As shown in FIG. 2A, the first voltage line VGH and the reset signal line Reset are arranged adjacent to each other and extend along the first direction, and the reset signal line Reset is arranged close to a plurality of clock signal lines. The active layers of the first transistor T5, the second transistor T8, the third transistor T7, the fourth transistor T11, the fifth transistor T12, the sixth transistor T2, the seventh transistor T3, the eighth transistor T1, the ninth transistor T13, the tenth transistor T4, the eleventh transistor T14, and the twelfth transistor T6 are respectively located at a side of an orthographic projection of the reset signal line Reset on the base substrate that is close to a plurality of clock signal lines on the base substrate. An orthographic projection of the active layer of the thirteenth transistor T9 and an orthographic projection of the active layer of the fourteenth transistor T10 on the base substrate are located at a side of the first voltage line VGH on the base substrate that is away from the plurality of clock signal lines.

As shown in FIG. 2A, the orthographic projection of the second capacitor on the base substrate 10 is within the orthographic projection of the first voltage line VGH on the base substrate 10.

In some embodiments of the present disclosure, the first conductive layer Gate1 shown in FIG. 2C may be provided on a first insulating layer, so as to be insulated from the active layer shown in FIG. 2B. For example, the first conductive layer Gate1 may include: a first electrode plate C4a of the first capacitor C4, a first electrode plate C1a of the second capacitor C1 and a first electrode plate C2a of the third capacitor C2, the gate electrodes G1-G14 of the transistor T1 to the transistor T14, various connection lines (for example, the connection lines L1-L3) and wires (for example, the wires M1, M2 and M3) for connection with signal lines or transfer electrodes and the like in the third conductive layer. The wires M1, M2 and M3 are all independent figures. As shown in FIG. 2C, the gate electrodes G1-G14 of the transistors T1 to T14 are the portions that are circled by circle dashed lines or ellipse dashed lines, that is, the portions where the active layer structures of various transistors shown in FIG. 2B overlap with the electrodes or lines in the first conductive layer Gate1.

FIG. 2D shows a second conductive layer Gate2 of the display substrate, the second conductive layer Gate2 includes a second electrode plate C4b of the first capacitor C4, a second electrode plate C1b of the second capacitor C1 and a second electrode plate C2b of the third capacitor C2, and a plurality of connection lines. For example, the plurality of connection lines include an output terminal OUT.

It should be noted that in the embodiment of the present disclosure, the output terminal OUT that is located at the second conductive layer Gate 2 can be used to provide an output signal to the pixel units in the display region. In other embodiments of the present disclosure, the output signal of the output terminal OUT of the shift register unit may also be provided by electrodes located in other layers, that is, the output terminal OUT may also be located in other layers different from the second conductive layer Gate2, for example, in the first conductive layer Gate1, which is not limited by the embodiments of the present disclosure.

As shown in FIG. 2E, the via holes shown in FIG. 2E are via holes penetrating through a third insulating layer, the second insulating layer, and the first insulating layer, and via holes penetrating through the third insulating layer and the second insulating layer.

The first insulating layer is located between the active layer shown in FIG. 2B and the first conductive layer Gate1 shown in FIG. 2C to insulate the active layer from the first conductive layer Gate1. The second insulating layer is located between the first conductive layer Gate1 and the second conductive layer Gate2 to insulate the first conductive layer Gate1 and the second conductive layer Gate2. The third insulating layer is located between the second conductive layer Gate2 and the third conductive layer to insulate the second conductive layer Gate2 and the third conductive layer.

FIG. 2F shows the third conductive layer SD of the display substrate, and the third conductive layer SD includes a plurality of signal lines (for example, clock signal line CK', clock signal line CK, clock signal line CB' and clock signal line CB), the second voltage line VGL, the first voltage line VGH, the reset signal line Reset and the like. It should be noted that the third conductive layer SD also includes transfer electrodes ET1-ET15, etc., which are connected between various transistors, capacitors and signal lines.

Figure 3B:
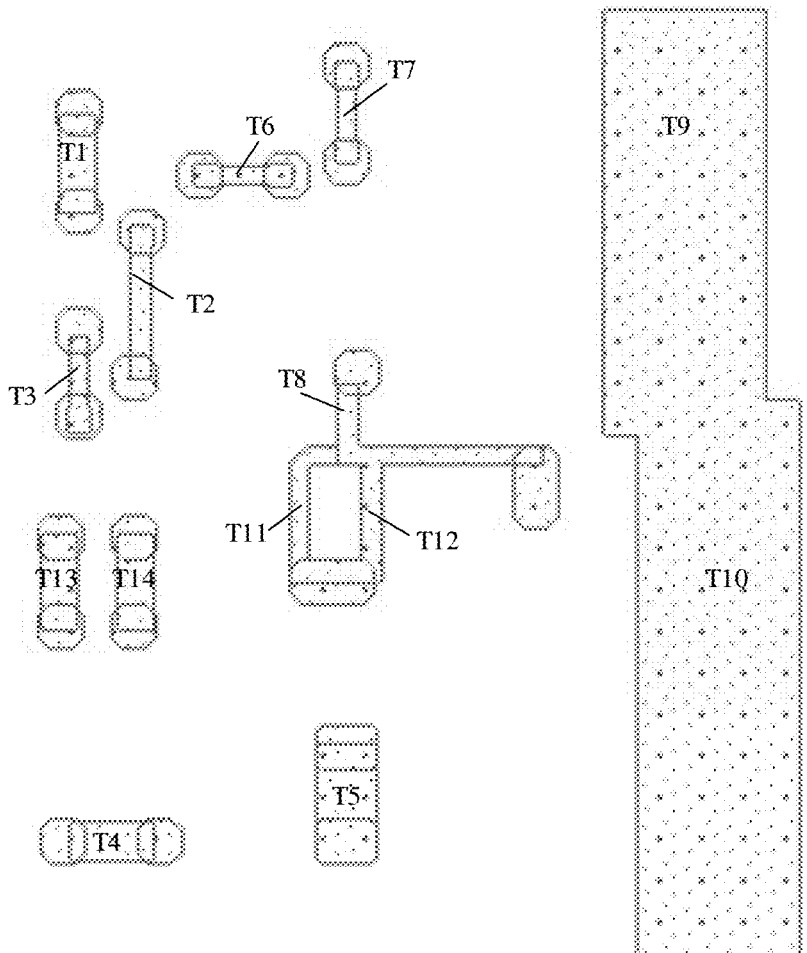
FIG. 3B shows a plan view of an active layer of the display substrate in FIG. 3A provided by at least one embodiment of the present disclosure.
Figure 3C:
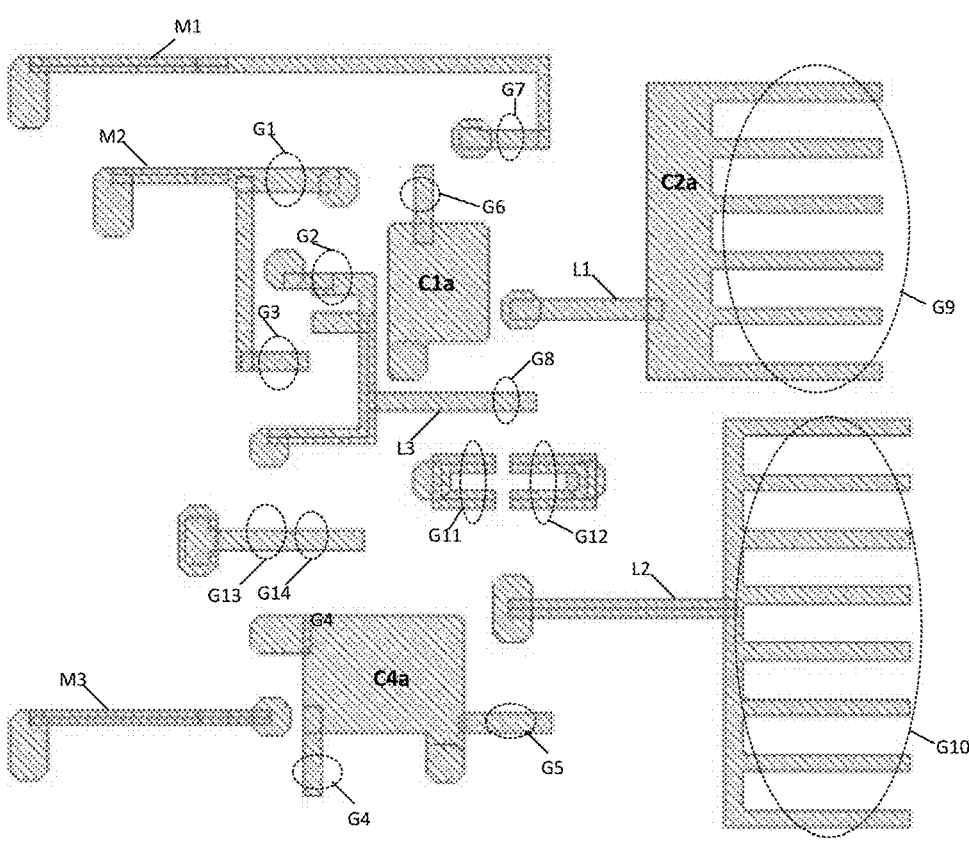
FIG. 3C shows a plane view of a first conductive layer of the display substrate in FIG. 3A provided by at least one embodiment of the present disclosure.
Figure 3D:
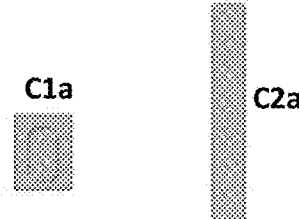
FIG. 3D shows a plan view of a second conductive layer of the display substrate in FIG. 3A provided by at least one embodiment of the present disclosure.
Figure 3D:
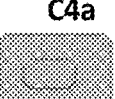
Figure 3D:
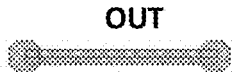
Figure 3E:
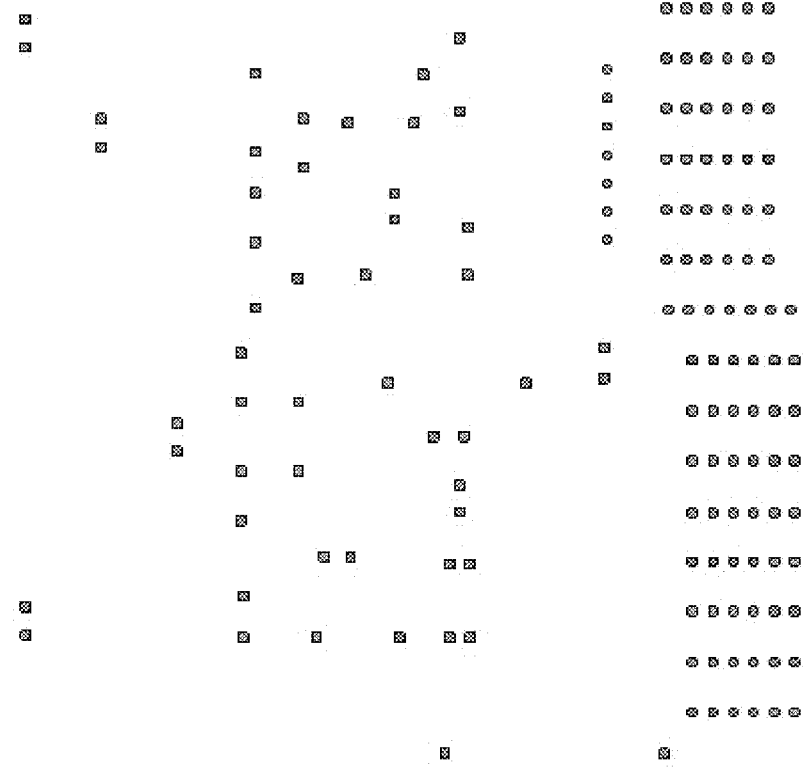
FIG. 3E shows a via holes distribution diagram of a second insulating layer of the display substrate in FIG. 3A provided by at least one embodiment of the present disclosure.
Figure 3F:
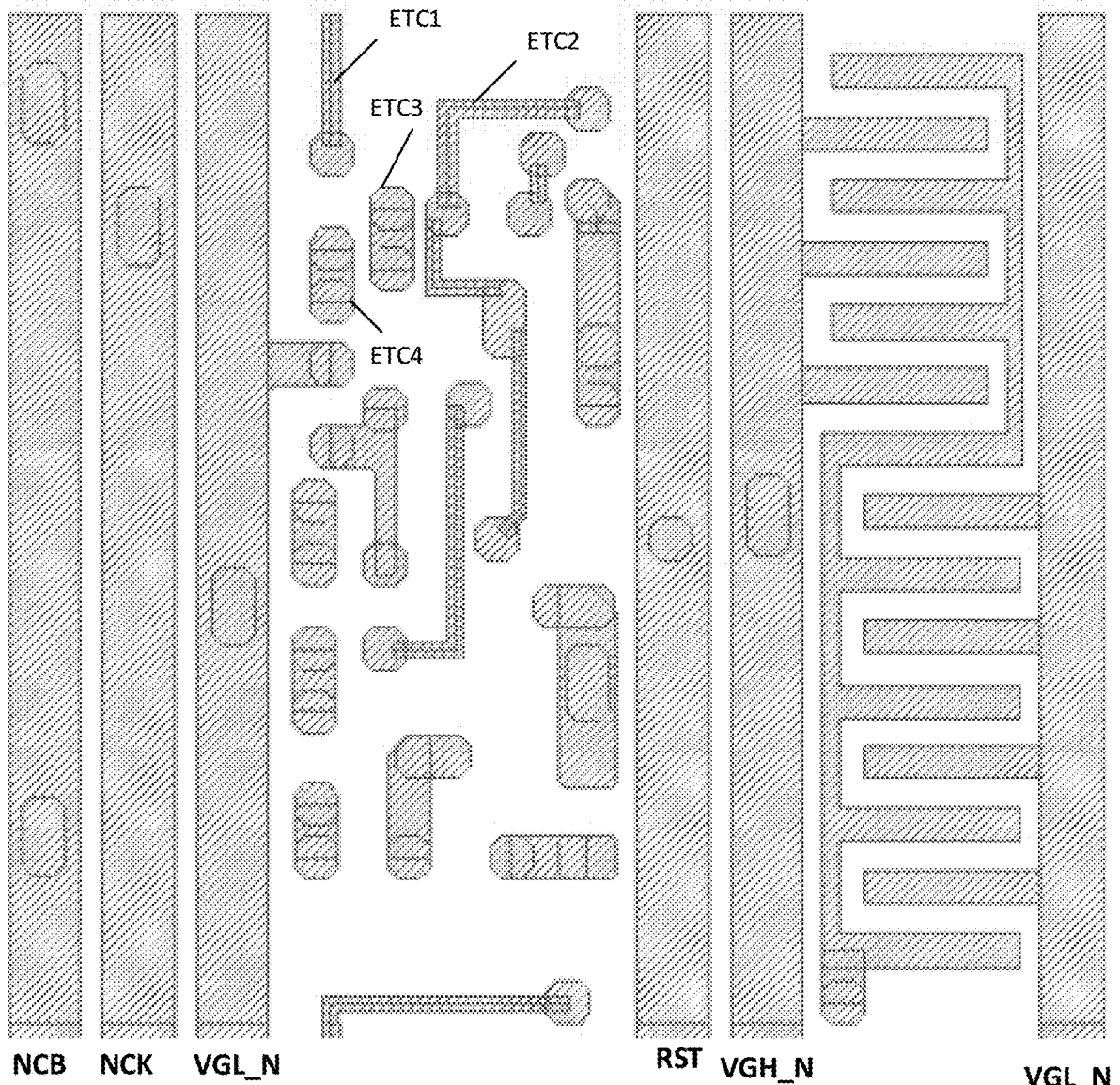
FIG. 3F shows a plan view of a third conductive layer of the display substrate in FIG. 3A provided by at least one embodiment of the present disclosure.

FIG. 3A shows another schematic layout diagram of the shift register unit shown in FIG. 1C on a display substrate provided by at least one embodiment of the present disclosure. FIG. 3B shows a plan view of an active layer of the display substrate in FIG. 3A provided by at least one embodiment of the present disclosure. FIG. 3C shows a plane view of a first conductive layer of the display substrate in FIG. 3A provided by at least one embodiment of the present disclosure. FIG. 3D shows a plan view of a second conductive layer of the display substrate in FIG. 3A provided by at least one embodiment of the present disclosure. FIG. 3E shows a via hole distribution diagram of a second insulating layer of the display substrate in FIG. 3A provided by at least one embodiment of the present disclosure. FIG. 3F shows a plan view of a third conductive layer of the display substrate in FIG. 3A provided by at least one embodiment of the present disclosure.

As shown in FIG. 3B, a plan view of an active layer of the display substrate is similar to FIG. 2B. Please refer to the description of FIG. 2B above for the active layer of the display substrate in FIG. 3A, and details are not described herein again. The differences between the layout of the display substrate in FIG. 3A and the layout of the display substrate in FIG. 2A are mainly embodied in first capacitor C4 and second capacitor C1.

As shown in FIG. 3A, the display substrate includes a base substrate 20, as well as a shift register unit 300, a first voltage line VGH_N, a second voltage line VGL_N, and a plurality of clock signal lines that are provided on the base substrate 20. For example, the plurality of clock signal lines include the clock signal line NCK and the clock signal line NCB, and may further include a trigger signal line (not shown in the figures). The clock signal line NCK is an example of the first clock signal line and the second clock signal line, and the clock signal line NCB is an example of the third clock signal line and the fourth clock signal line.

As shown in FIG. 3A, an orthographic projection of the active layer of the ninth transistor T13 on the base substrate, an orthographic projection of the active layer of the eighth transistor T1 on the base substrate and an orthographic projection of the active layer of the seventh transistor T3 on the base substrate are located on a first side of an orthographic projection of the first capacitor on the base substrate and are sequentially arranged along the first direction Y. An orthographic projection of the active layer of the first transistor T5 on the base substrate is located on a second side of the first capacitor C4 on the base substrate. The first side of the first capacitor C4 on the base substrate is a side of the first capacitor C4 that is close to the clock signal line NCK on the base substrate, the second side of the first capacitor C4 on the base substrate is a side of the first capacitor C4 that is away from the clock signal line NCK on the base substrate, and the orthographic projection of the first capacitor C4 on the base substrate is located between the ninth transistor T13 and the tenth transistor T4 in the first direction Y.

As shown in FIG. 3A, the orthographic projection of the active layer of the twelfth transistor T6 on the base substrate extends along the second direction X, and in the second direction, the orthographic projection of the active layer of the twelfth transistor T6 on the base substrate and the orthographic projection of the second capacitor C1 on the base substrate are located between the orthographic projection of the active layer of the sixth transistor T2 on the base substrate and the orthographic projection of the active layer of the third transistor T7 on the base substrate. The orthographic projection of the active layer of the twelfth transistor T6 on the base substrate is located on a side of the orthographic projection of the second capacitor C1 on the base substrate that is away from the first capacitor C4. In the second direction X, the active layer of the third transistor T7 is located on a side of the twelfth transistor T6 that is away from the second capacitor.

In some embodiments of the present disclosure, a width-to-length ratio of a channel of the tenth transistor T4 is greater than 1.75. For example, the width-to-length ratio of the channel of the tenth transistor T4 in FIG. 2A or FIG. 3A is equal to 2.

In an embodiment of the present disclosure, a width-to-length ratio of a channel of the first transistor T5 is greater than 2, for example, the width-to-length ratio of a channel of the first transistor T5 in FIG. 2A or FIG. 3A is equal to 3.

By optimizing the width-to-length ratio of the channel of the tenth transistor T4 and the width-to-length ratio of the channel of the first transistor T5, the output reset capability of the GOA can be enhanced, and the multi-step problem occurring due to too long reset time caused by transistor attenuation after a period of time can be avoided at least partly, thereby prolonging the service life of the GOA.

In some embodiments of the present disclosure, the first conductive layer LY1 shown in FIG. 3C may be provided on the first insulating layer, so as to be insulated from the active layer shown in FIG. 3B. For example, the first conductive layer LY1 may include a first electrode plate C4$a$ of the first capacitor C4, a first electrode plate C1$a$ of the second capacitor C1, a first electrode plate C2$a$ of the third capacitor C2, gate electrodes G1-G14 of the transistor T1 to the transistor T14, various connection lines (for example, a connection lines L1-L3) and wires (for example, wire M1, wire M2, and wire M3) for connecting to a signal line or a transfer electrode in the third conductive layer. The wire M1, the wire M2, and the wire M3 are all independent graphs. As shown in FIG. 3C, the gate electrodes G1-G14 of the transistors T1 to T14 are the portions that are circled by circle dashed lines or ellipse dashed lines, that is, the portions where the active layer structures of various transistors shown in FIG. 3B overlap with the electrodes or lines in the first conductive layer Gate1.

FIG. 3D shows the second conductive layer LY2 of the display substrate, and the second conductive layer LY2 includes the second electrode plate C4$b$ of the first capacitor C4, the second electrode plate C1$b$ of the second capacitor C1, the second electrode plate C2$b$ of the third capacitor C2, and the output terminal OUT.

It should be noted that, in the embodiments of the present disclosure, the output terminal OUT that is located on the second conductive layer LY2 may be configured to provide an output signal to the pixel units of the display region. In some other embodiments of the present disclosure, the output signal of the output terminal OUT of the shift register unit may also be provided by an electrode located in other layers, that is, the output terminal OUT may also be provided in other layers different from the second conductive layer LY2, for example, may be provided in the first conductive layer LY1, which is not limited in the embodiments of the present disclosure.

As shown in FIG. 3E, via holes shown in FIG. 3E are via holes that penetrate through the third insulating layer, the second insulating layer and the first insulating layer, and via holes that penetrate through the third insulating layer and the second insulating layer.

The first insulating layer is located between the active layer shown in FIG. 3B and the first conductive layer LY1 shown in FIG. 3C, so that the active layer and the first conductive layer LY1 are insulated from each other. The second insulating layer is located between the first conductive layer LY1 and the second conductive layer LY2, so that the first conductive layer LY1 and the second conductive layer LY2 are insulated from each other. The third insulating layer is located between the second conductive layer LY2 and the third conductive layer LY3, so that the second conductive layer LY2 and the third conductive layer LY3 are insulated from each other.

FIG. 3F shows the third conductive layer LY3 of the display substrate, and the third conductive layer LY3 includes a plurality of signal lines (for example, the clock signal line NCK and the clock signal line NCB), the second voltage line VGL_N, the first voltage line VGH_N and the reset signal line RST, etc. It should be noted that the third conductive layer LY3 may further includes a transfer electrode ETC1-ETC5 between various transistors, capacitors, and signal lines.

Figures 4A, 4B:
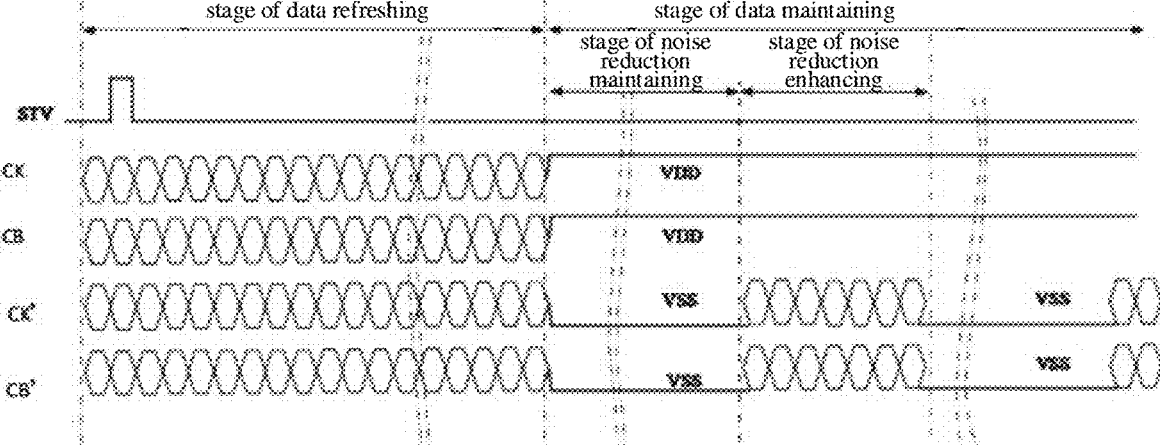
FIG. 4A shows a signal timing diagram of the shift register unit shown in FIG. 1C during operation.
FIG. 4B shows a schematic diagram of driving timing among a first clock signal, a second clock signal, a third clock signal, and a fourth clock signal provided by at least one embodiment of the present disclosure.

At least one embodiment of the present disclosure further provides a driving method of a shift register unit. FIG. 4A shows a signal timing diagram of the shift register unit shown in FIG. 1C during operation. In the shift register unit, the first clock signal line and the second clock signal line are the same signal line, and the connection terminals of the first clock signal line and the second clock signal line are represented by the clock signal terminal CK below. The third clock signal line and the fourth clock signal line are the same signal line, and the third clock signal line and the fourth clock signal line are represented by the clock signal terminal CB below. For example, the driving method is applied to the display substrate shown in FIG. 3A.

For example, as shown in FIG. 1C, the driving method includes a first operation stage S1 and a second operation stage S2. In the first operation stage S1, the driving method includes a first sub-stage t1, a second sub-stage t2 and a third sub-stage t3. A frame includes a first operation stage S1 (i.e., the display stage) and a second operation stage S2 (i.e., the blanking stage), the display stage is used to drive the display panel to display, and the blanking stage is a stage between the display stage of the current frame and the display stage of the next frame. The signal levels in the signal timing diagram shown in FIG. 4A are only schematic and do not represent actual level values.

In some other examples, the driving method further includes a fourth sub-stage t4, a fifth sub-stage t5 and a sixth sub-stage t6.

For example, the first sub-stage t1 is an input stage t1, the second sub-stage t2 is an output stage t2, the third sub-stage t3 is a reset stage t3, the fourth sub-stage t4 is a first holding stage t4, and the fifth sub-stage t5 is a second holding stage t5, and the sixth sub-stage t6 is a third holding stage t6. In the first operation stage S1, the reset signal line Reset provides a high level, and the fifth transistor T12 is turned off in response to the high level of the reset signal.

In the input stage t1, the clock signal terminal CK provides a low level, the clock signal terminal CB provides a high level, the input terminal IN provides a high level, the eighth transistor T1 is turned on in response to the low level of clock signal CK, the ninth control transistor T13 is turned on in response to the second voltage provided by the second voltage line VGL, the potential of the first node P1 is at a high level, the potential of the second control node P22 is at a high level, and the tenth transistor T4 and the first transistor T5 are both turned off in response to the high level of the second control node P22. The sixth transistor T2 is turned off in response to the high level of the first node P1, the seventh transistor T3 is turned on in response to the low level of the clock signal CK, and the eleventh control transistor T14 is turned on in response to the second voltage provided by the second voltage line VGL. The potential of the fourth node P4 is at a low level, and the potential of the third control node P23 is at a low level. The twelfth transistor T6 is turned on in response to the low level of the third control node P23. The potential of the first control node P21 is at a high level, the third transistor T7 is turned off in response to the high level of the clock signal CB, the second transistor T8 is turned off in response to the high level of the first node, and the fourth transistor T11 is turned off in response to the high level of the first control node P21. The potential of the second node P2 is maintained at a high level, and the potential of the third node P3 is maintained at a high level, the fourteenth transistor T10 is turned off in response to the high level of the second node, the thirteenth transistor T9 is turned off in response to the low level of the third node P3, and the output terminal OUT outputs a low level.

In the output stage t2, the clock signal terminal CK provides a high level, the clock signal terminal CB provides a low level, the input terminal IN provides a low level, the eighth transistor T1 is turned off, the ninth transistor T13 is turned on, and the potential of the first node P1 and the potential of the second control node P22 are maintained at a high level. The tenth transistor T4 is turned off, the first transistor T5 is turned off, the sixth transistor T2 and the seventh transistor T3 are turned off, the potential of the fourth node P4 is maintained at a low level, the twelfth transistor T6 is turned on, the low level provided by the clock signal terminal CB is input to the first control node P21, and the first control node P21 changes from a high level to a low level. According to the charge conservation principle of the second capacitor C1, the potential of the third control node P23 is further pulled down by the second capacitor C1, the third transistor T7 is turned on, the first transistor T8 is turned off, the fourth transistor T11 is turned on in response to the low level of the first control node P21, the potential of the third node P3 is at a low level, and the potential of the second node P2 is still at a high level. Therefore, the thirteenth transistor T9 is turned on, the fourteenth transistor T10 is turned off, and the output terminal OUT outputs the high level provided by the first voltage line VGH.

In the reset stage t3, the clock signal terminal CK provides a low level, the clock signal terminal CB provides a high level, the input terminal IN provides a low level, the eighth transistor T1 is turned on, the potential of the first node P1 is pulled down, the ninth transistor T13 is turned on, the potential of the second control node P22 is pulled down, the first transistor T5 is turned on, and the potential of the second node P2 is pulled down. The fourteenth transistor T10 is turned on in response to the level of the second node P2, the second voltage provided by the second voltage line VGL is output to the output terminal OUT, and the output terminal OUT outputs a low level, so as to achieve the noise reduction for the output terminal OUT. The sixth transistor T2 and the seventh transistor T3 are turned on, the potential of the fourth node P4 is at a low level, the eleventh transistor T14 is turned on, the twelfth transistor T6 is turned on, the first control node P21 becomes the high level provided by the clock signal terminal CB, the potential of the third control node P23 is pulled up according to the charge conservation principle of the second capacitor C1, and the third transistor T7 is turned off. The second transistor T8 is turned on in response to the low level of the first node, the potential of the third node P3 is pulled up, and the thirteenth transistor T9 is turned off.

In the first holding stage t4 included in the holding stage, the clock signal terminal CK provides a high level, the clock signal terminal CB provides a low level, the input terminal IN provides a low level, and the eighth transistor T1 is turned off, the potential of the first node P1 is maintained at a low level, the ninth transistor T13 is turned on, the tenth transistor T4 is turned on, the clock signal terminal CB pulls down the potential of the second control node P22 by the first capacitor C4, and the first transistor T5 is turned on, so that the potential of the second node P2 is maintained lower than (VGL+Vth), and Vth is the threshold voltage of the fourteenth transistor T10, so that the fourteenth transistor T10 is turned on, and so that the potential of the gate driving signal output by the output terminal OUT is maintained at the second voltage, that is, at a low level, and not affected by noise interference. The seventh transistor T3 is turned off, the sixth transistor T2 is turned on, and the potential of the fourth node P4 is the high level provided by the clock signal terminal CK. The eleventh transistor T14 is turned on, the potential of the third control node P23 is at a high level, the potential of the first control node P21 is at a high level, the third transistor T7 is turned on, the second transistor T8 is turned on, the potential of the third node P3 is at a high level, and the thirteenth transistor T9 is turned off.

In the second holding stage t5 included in the holding stage, the clock signal terminal CK provides a low level, the clock signal terminal CB provides a high level, the input terminal IN provides a low level, the eighth transistor T1 is turned on, the potential of the first node P1 is at a low level, the ninth transistor T13 is turned on, the second control node P22 is at a low level, the tenth transistor T4 is turned on in response to the low level of the second control node P22, and the potential of the input clock signal provided by the clock signal terminal CB increases. According to the charge conservation principle of the first capacitor C4, the potential of the second control node P22 is pulled up, the first transistor T5 is turned off, and potential of the second node P2 is not affected, so that the potential of the second node P2 is maintained lower than (VGL+Vth), and Vth is the threshold voltage of the fourteenth transistor T10, so that the fourteenth transistor T10 is turned on, and so that the potential of the gate driving signal output by the output terminal OUT is maintained at the second voltage, that is, at a low level, and not affected by noise interference. The seventh transistor T3 is turned on, the potential of the second node P2 is at a low level, the sixth transistor T2 is turned on, and the eleventh transistor T14 is turned on, the potential of the third control node P23 is at a low level, the twelfth transistor T6 is turned on, the potential of the first control node P21 is at a high level, the third transistor T7 is turned off, the second transistor T8 is turned off, the potential of the third node P3 is maintained at a high level, and the thirteenth transistor T9 is turned off.

In the third holding stage t6 included in the holding stage, the clock signal terminal CK provides a high level, the clock signal terminal CB provides a low level, the input terminal IN provides a low level, and the input transistor T1 is turned off, the potential of the first node P1 is maintained at a low level, the tenth transistor T4 is turned on, the clock signal terminal CB pulls down the potential of the second control node P22 by the first capacitor C4, and the first transistor T5 is turned on, so that the potential of the second node P2 is maintained lower than (VGL+Vth), and Vth is the threshold voltage of the fourteenth transistor T10, so that the fourteenth transistor T10 is turned on, and so that the potential of the gate driving signal output by the output terminal OUT is maintained at the second voltage, that is, at a low level, and not affected by noise interference. The seventh transistor T3 is turned off, the sixth transistor T2 is turned on, the potential of the fourth node P4 is at a high level, the eleventh transistor T14 is turned on, the potential of the third control node P23 is at a high level, the twelfth control transistor T6 is turned off, the potential of the first control node P21 is at a high level, the third transistor T7 is turned on, the second transistor T8 is turned on, the potential of the third node P3 is a high level, and the thirteenth transistor T9 is turned off.

In the holding stage, the potential of the second node P2 is maintained lower than (VGL+Vth), and Vth is the threshold voltage of the fourteenth transistor T10, so that the fourteenth transistor T10 is turned on, and so that the potential of the gate driving signal output by the output terminal OUT is maintained at the second voltage, and not affected by noise interference.

For example, as shown in FIG. 4A, in the second operation stage S2, the driving method of the shift register unit includes at least one reset stage t7. Only one reset stage t7 is shown in FIG. 4A, which is not limited by embodiments of the present disclosure.

For example, in at least one reset stage t7, a valid level (e.g., a low level) of the reset signal is applied to the reset signal line Reset, and an invalid level (for example, a high level) of the clock signal is applied to the clock signal terminal CLK. The fifth transistor T12 turns off the fourteenth transistor in response to the valid level of the reset signal.

As shown in FIG. 4A, in the reset stage t7, the clock signal terminal CK provides a high level, the clock signal terminal CB provides a high level, the input terminal IN provides a low level, the reset signal line Reset provides a low level, the eighth transistor T1 is turned off, the potential of the first node P1 is maintained at a low level, the ninth transistor T13 is turned on, the second control node P22 is at a low level, the tenth transistor T4 is turned on in response to the low level of the second control node P22, and the potential of the input clock signal provided by the clock signal terminal CB increases. According to the charge conservation principle of the first capacitor C4, the potential of the second control node P22 is pulled up, and the first transistor T5 is turned off. Since the fifth transistor T12 is turned on in response to the low level of the reset signal, the first voltage line VGH is connected to the second node P2, thereby pulling up the voltage of the second node P2 and turning off the fourteenth transistor T10, so that the fourteenth transistor T10 is turned off in at least one reset stage t7 of the second operation stage S2, and therefore, it can be avoided that the fourteenth transistor T10 is always turned on in the second operation stage S2 which affect the output reset and noise reduction capability of the output noise reduction circuit 204, thus prolonging the service life of the shift register unit and improving the display quality of the display panel. At this stage, the sixth transistor T2 is turned on, and the seventh transistor T3 is turned off, so that the fourth node P4 is connected to the clock signal line CK, the potential of the fourth node P4 is a high level provided by the clock signal line CK, the eleventh transistor T14 is turned on, the potential of the third control node P23 is at a high level, the twelfth transistor T6 is turned off, the potential of the first control node P21 is maintained at a high level, the third transistor T7 is turned off, the second transistor T8 is turned on, the potential of the third node P3 is maintained at a high level, and the thirteenth transistor T9 is turned off.

According to the above analysis of the signal timing when the shift register unit works, it can be seen that the tenth transistor T4 and the first transistor T5 have a relatively great influence on the reset and noise reduction of the shift register unit, and therefore, the tenth transistor T4 and the first transistor T5 may be optimized.

FIG. 4B shows a schematic diagram of driving timing among a first clock signal, a second clock signal, a third clock signal and a fourth clock signal provided by at least one embodiment of the present disclosure. The driving timing is, for example, applied to the display substrate shown in FIG. 2A.

As shown in FIG. 4B, in the driving timing, when the data is refreshed, CK/CB are used as a group of clock signals, CK'/CB' are used as a group of clock signals, and the two groups of signals are the same. When the frame is maintained at low frequency, CK/CB are kept at a high level, CK'/CB' are kept at a low level or kept at low level most of the time (e.g., about 10 ms), and then several (e.g., 8) CK/CB pulses are periodically inserted to ensure that the output level OUT is maintained at VGL.

Figures 5A, 5B:
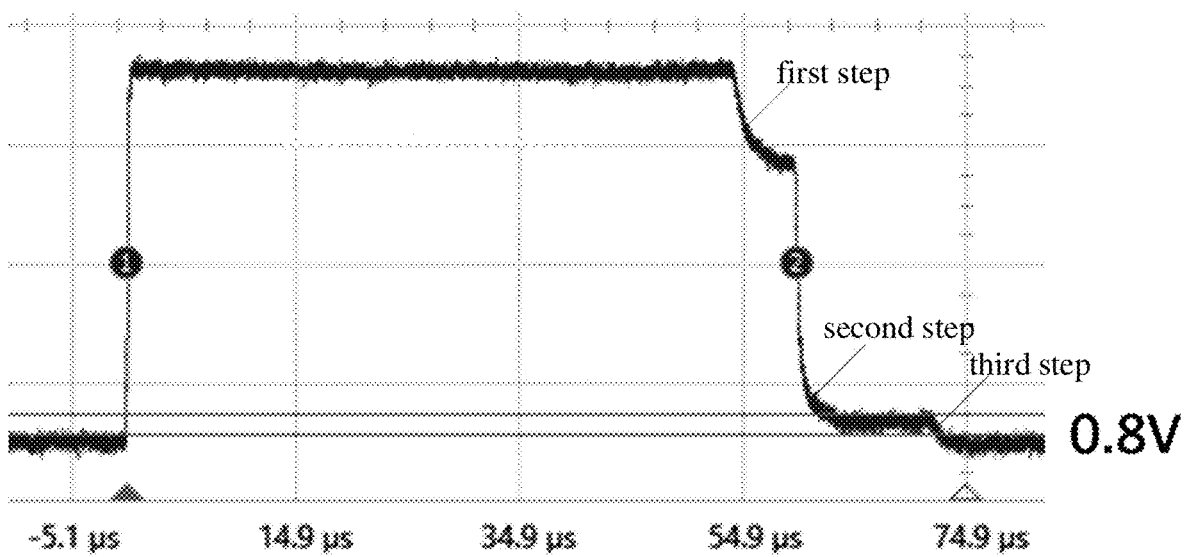
FIG. 5A shows a schematic diagram of multi-step phenomenon of a gate driving circuit.
FIG. 5B shows a schematic diagram of a change in an output signal of a shift register following a width change of a tenth transistor provided by at least one embodiment of the present disclosure.

FIG. 5A shows a schematic diagram of multi-step phenomenon of a gate driving circuit.

As shown in FIG. 5A, after the shift register unit in the gate driving circuit works for a certain period of time, the voltage values of the output signal output by the shift register unit have a plurality of steps. As shown in FIG. 5A, the plurality of steps include, for example, a first step, a second step, and a third step.

In order to solve the problem that the GOA outputs the plurality of steps, the bias voltage analysis of the transistors within the GOA is performed, and the tenth transistor T4 and the first transistor T5 are mainly analyzed.

For example, the length of the tenth transistor T4 is fixed, and the influence of the width of the tenth transistor T4 on the output signal of the shift register is analyzed. For example, the length of the tenth transistor is fixed at 4 μm.

FIG. 5B shows a schematic diagram of a change in an output signal of a shift register following a width change of a tenth transistor T4 provided by at least one embodiment of the present disclosure.

In the following, the length or width of the transistor may refer to the length or width of the channel of the transistor.

As shown in FIG. 5B, for example, the length of the tenth transistor T4 is 4 μm, in a case where the width of the tenth transistor T4 is 4 μm, the period of the falling edge of the output signal is 13 μs, and at this time, two steps are existed in the falling edge. As the width of the tenth transistor T4 increases, the period of the falling edge decreases step by step, and the steps also gradually disappear. In a case where the width of the tenth transistor T4 is greater than or equal to 7 μm, the period of the falling edge is 1.9 μs, and the steps are disappeared. Therefore, the width of the tenth transistor T4 may be 8 μm.

For example, the length of the first transistor T5 is fixed, so as to analyze the influence of the width of the first transistor T5 on the output signal of the shift register. For example, the length of the first transistor T5 is fixed to 4 μm.

FIG. 5C shows a schematic diagram of a change in an output signal of a shift register following a width change of a first transistor T5 provided by at least one embodiment of the present disclosure.

As shown in FIG. 5C, for example, the length of the first transistor T5 is 4 μm, in a case where the width of the first transistor T5 is 4 μm, the period of the falling edge of the output signal is 2.3 μs, and at this time, the shift register has a reset delay. In a case where the width of the first transistor T5 is 8 μm, two steps are existed. In a case where the width of the tenth transistor T4 is greater than or equal to 11, the period of the falling edge is stabilized to 2.4 μs, and the steps are disappeared. Therefore, the width of the first transistor T5 may be 12 μm.

For example, the width of the first transistor T5 is fixed, so as to analyze the influence of the length of the first transistor T5 on the output signal of the shift register. For example, the width of the first transistor T5 is fixed to 8 μm.

FIG. 5D shows a schematic diagram of a change in an output signal of a shift register following a length change of a first transistor T5 provided by at least one embodiment of the present disclosure.

As shown in FIG. 5D, for example, the width of the first transistor T5 is 8 μm, in a case where the length of the first transistor T5 is 6 μm, the period of the falling edge of the output signal is 2.4 μs, and at this time, the shift register has a reset delay. In a case where the length of the first transistor T5 is 5.5 μm, two steps are existed. In a case where the length of the tenth transistor T4 is equal to 4.5 μm, the step is raised. In a case where the length of the tenth transistor T4 is equal to 4 μm, the steps are disappeared. Therefore, the width of the first transistor T5 may be 4 μm.

In some embodiments of the present disclosure, for the tenth transistor T4, as the width-to-length ratio of the tenth transistor T4 increases, the multi-step phenomenon gradually disappears. In a case where the width-to-length ratio of the channel of the tenth transistor T4 is 1.75, the multi-step phenomenon disappears. For example, if the length of the channel of the tenth transistor T4 is 4 μm, the width of the channel of the tenth transistor T4 may be set to 8 μm. For the first transistor T5, as the width-to-length ratio of the first transistor T5 increases, the multi-step phenomenon gradually disappears. In a case where the width-to-length ratio of the channel of the first transistor T5 is 2, the multi-step phenomenon disappears. For example, if the width of the channel of the first transistor T5 is 12 μm, the length of the channel of the first transistor T5 may be set to 4 μm.

For example, in the layouts of the display substrate shown in FIG. 2A and FIG. 3A, the width of the channel of the tenth transistor T4 is 8 μm, the length of the channel of the tenth transistor T4 is 4 μm, the width of the channel of the first transistor T5 is 12 μm, and the length of the channel of the first transistor T5 is 4 μm.

Figure 6:
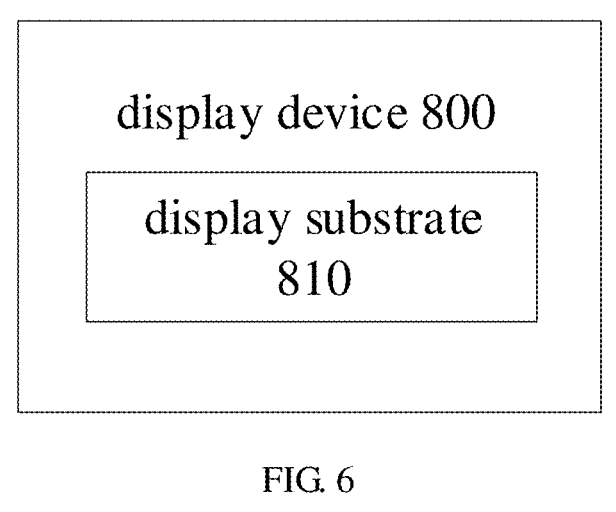

FIG. 6 is a schematic block diagram of a display device provided by at least one embodiment of the present disclosure.

As shown in FIG. 6, the display device 800 may include a display substrate 810, and the display substrate 810 may be a display substrate in any embodiment of the present disclosure.

The display device can improve the density of the gate driving circuit layout, thereby reducing the size of the peripheral region and facilitating the realization of a narrow frame.

The following points need to be noted for the present disclosure:

(1) In the drawings of the embodiments of the present disclosure, only the structures related to the embodiments of the present disclosure are involved, and other structures may refer to the common design(s).

(2) In case of no conflict, features in one embodiment or in different embodiments of the present disclosure may be combined to obtain new embodiments.

The above are merely particular embodiments of the present disclosure but are not limitative to the scope of the present disclosure; the scopes of the present disclosure should be defined in the appended claims.

What is claimed is:

1. A display substrate, comprising:

a base substrate; and a gate driving circuit provided on a peripheral region of the base substrate, wherein the gate driving circuit comprises a plurality of shift register circuits that are arranged in a first direction, each shift register circuit comprises an input circuit, a control circuit, an output circuit and an output noise reduction circuit, the input circuit is connected to an input terminal and configured to control a level of a first node in response to an input signal that is input by the input terminal, the control circuit is connected to the first node, a second node and a third node, the output circuit is connected to the third node and an output terminal, respectively, and is configured to provide an output signal to the output terminal, the output noise reduction circuit is connected to the second node and the output terminal, respectively, and is configured for noise reduction on the output terminal, the control circuit comprises a first transistor, a second transistor and a third transistor, a first electrode of the first transistor is directly connected to the second node and configured to control a level of the second node, a first electrode of the second transistor is connected to the third node, a second electrode of the second transistor is connected to a first voltage line to receive a first voltage, a gate electrode of the second transistor is directly connected to the first node, and the second transistor is configured to control a level of the third node in response to the level of the first node, a first electrode of the third transistor is connected to the third node and configured to control the level of the third node, and at least two selected from group consisting of an active layer of the first transistor, an active layer of the second transistor and an active layer of the third transistor extend in the first direction and are sequentially arranged in the first direction, wherein the control circuit further comprises: a fourth transistor and a fifth transistor, a first electrode of the fourth transistor is connected to the first voltage line to receive the first voltage, a second electrode of the fourth transistor is connected to the second node, a gate electrode of the fourth transistor is connected to a first control node, and the fourth transistor is configured to control the level of the second node in response to a level of the first control node;

a first electrode of the fifth transistor is connected to the first voltage line to receive the first voltage, a second electrode of the fifth transistor is connected to the second node, a gate electrode of the fifth transistor is connected to a reset signal line, and the fifth transistor is configured to reset the second node; and an active layer of the fourth transistor and an active layer of the fifth transistor extend in the first direction, respectively, and are arranged along a second direction, and the second direction intersects with the first direction.

2. The display substrate according to claim 1, wherein the active layer of the first transistor, the active layer of the second transistor and the active layer of the third transistor extend in the first direction and are sequentially arranged in the first direction.

3. The display substrate according to claim 1, wherein the active layer of the fifth transistor and the active layer of the second transistor are integrally provided.

4. The display substrate according to claim 3, wherein in the first direction, the active layer of the fourth transistor and the active layer of the fifth transistor are located between the active layer of the first transistor and the active layer of the second transistor.

5. The display substrate according to claim 3, wherein the control circuit further comprises: a sixth transistor and a seventh transistor, and the input circuit comprises an eighth transistor, a gate electrode of the sixth transistor is connected to the first node, a first electrode of the sixth transistor is connected to a first clock signal line to receive a first clock signal, and a second electrode of the sixth transistor is connected to a fourth node;

a gate electrode of the seventh transistor is connected to a second clock signal line to receive a second clock signal, a first electrode of the seventh transistor is connected to a second voltage line to receive a second voltage, and a second electrode of the seventh transistor is connected to the fourth node; and an active layer of the seventh transistor and an active layer of the eighth transistor are sequentially arranged in the first direction and extend along the first direction.

6. The display substrate according to claim 1, wherein in the first direction, the active layer of the fourth transistor and the active layer of the fifth transistor are located between the active layer of the first transistor and the active layer of the second transistor.

7. The display substrate according to claim 1, wherein the control circuit further comprises: a sixth transistor and a seventh transistor, and the input circuit comprises an eighth transistor, a gate electrode of the sixth transistor is connected to the first node, a first electrode of the sixth transistor is connected to a first clock signal line to receive a first clock signal, and a second electrode of the sixth transistor is connected to a fourth node;

a gate electrode of the seventh transistor is connected to a second clock signal line to receive a second clock signal, a first electrode of the seventh transistor is connected to a second voltage line to receive a second voltage, and a second electrode of the seventh transistor is connected to the fourth node; and an active layer of the seventh transistor and an active layer of the eighth transistor are sequentially arranged in the first direction and extend along the first direction.

8. The display substrate according to claim 7, wherein an active layer of the sixth transistor is located on a side of the active layer of the seventh transistor and the active layer of the eighth transistor that is away from the first clock signal line, and the active layer of the sixth transistor extends along the first direction.

9. The display substrate according to claim 7, wherein the control circuit further comprises a ninth transistor, a tenth transistor and a first capacitor, a gate electrode of the ninth transistor is connected to the second voltage line, a first electrode of the ninth transistor is connected to the first node, and a second electrode of the ninth transistor is connected to a second control node;

a gate electrode of the tenth transistor is connected to the second control node, a first electrode of the tenth transistor is connected to a third clock signal line to receive a third clock signal, and a second electrode of the tenth transistor is connected to a first electrode of the first capacitor;

a second electrode of the first capacitor is connected to the second control node;

the second control node is connected to a gate electrode of the first transistor, and the gate electrode of the first transistor is connected to a second electrode of the first transistor; and an active layer of the ninth transistor extends along the first direction and is sequentially arranged with the seventh transistor and the eighth transistor in the first direction, and an active layer of the tenth transistor extends along the second direction.

10. The display substrate according to claim 9, wherein an orthographic projection of the active layer of the ninth transistor on the base substrate, an orthographic projection of the active layer of the eighth transistor on the base substrate, and an orthographic projection of the active layer of the seventh transistor on the base substrate are located on a first side of an orthographic projection of the first capacitor on the base substrate, and are sequentially arranged along the first direction, an orthographic projection of the active layer of the first transistor on the base substrate is located on a second side of the first capacitor on the base substrate, the first side of the first capacitor on the base substrate is a side of the first capacitor that is close to the first clock signal line on the base substrate, the second side of the first capacitor on the base substrate is a side of the first capacitor that is away from the first clock signal line on the base substrate, and the orthographic projection of the first capacitor on the base substrate is located between the ninth transistor and the tenth transistor in the first direction; or the first capacitor comprises an extension portion that is close to the first clock signal line, and in the first direction, an orthographic projection of the extension portion on the base substrate is located between an orthographic projection of the tenth transistor on the base substrate and an orthographic projection of the ninth transistor on the base substrate, and the first transistor is located on the side of the first capacitor that is away from the first clock signal line on the base substrate.

11. The display substrate according to claim 9, wherein the tenth transistor is connected to the first electrode of the first capacitor through a first via hole and a second via hole, and an orthographic projection of the first via hole and an orthographic projection of the second via hole on the base substrate are within the orthographic projection of the first capacitor on the base substrate.

12. The display substrate according to claim 9, wherein the control circuit further comprises an eleventh transistor, a twelfth transistor and a second capacitor, a gate electrode of the eleventh transistor is connected to the second voltage line, a first electrode of the eleventh transistor is connected to the fourth node, and a second electrode of the eleventh transistor is connected to a third control node;

a gate electrode of the twelfth transistor is connected to the third control node, a first electrode of the twelfth transistor is connected to a fourth clock signal line to receive a fourth clock signal, and a second electrode of the twelfth transistor is connected to a first electrode of the second capacitor;

a second electrode of the second capacitor is connected to the first control node; and an active layer of the eleventh transistor extends along the first direction and is sequentially arranged with the active layer of the sixth transistor in the first direction, and the active layer of the ninth transistor and the active layer of the eleventh transistor are sequentially arranged in the second direction.

13. The display substrate according to claim 12, wherein an active layer of the twelfth transistor extends along the second direction, and in the second direction, an orthographic projection of the active layer of the twelfth transistor on the base substrate and an orthographic projection of the second capacitor on the base substrate are located between an orthographic projection of the active layer of the sixth transistor on the base substrate and an orthographic projection of the active layer of the third transistor on the base substrate, the orthographic projection of the active layer of the twelfth transistor on the base substrate is located on a side of the orthographic projection of the second capacitor on the base substrate that is away from the first capacitor, and in the second direction, the active layer of the third transistor is located on a side of the twelfth transistor that is away from the second capacitor; or the active layer of the twelfth transistor extends along the second direction, and the orthographic projection of the active layer of the twelfth transistor on the base substrate and the orthographic projection of the active layer of the sixth transistor on the base substrate are located on a side of the orthographic projection of the second capacitor on the base substrate that is close to the orthographic projection of the first capacitor on the base substrate.

14. The display substrate according to claim 9, wherein a width-to-length ratio of a channel of the tenth transistor is greater than 1.75.

15. The display substrate according to claim 1, wherein a width-to-length ratio of a channel of the first transistor is 3.

16. The display substrate according to claim 1, wherein the active layer of the first transistor is connected to the first electrode of the first transistor through a third via hole, and an orthographic projection of a channel of the first transistor on the base substrate does not overlap with an orthographic projection of the third via hole on the base substrate.

17. A display device, comprising a display substrate, wherein the display substrate comprises:

a base substrate; and a gate driving circuit provided on a peripheral region of the base substrate, wherein the gate driving circuit comprises a plurality of shift register circuits that are arranged in a first direction, each shift register circuit comprises an input circuit, a control circuit, an output circuit and an output noise reduction circuit, the input circuit is connected to an input terminal and configured to control a level of a first node in response to an input signal that is input by the input terminal, the control circuit is connected to the first node, a second node and a third node, the output circuit is connected to the third node and an output terminal, respectively, and is configured to provide an output signal to the output terminal, the output noise reduction circuit is connected to the second node and the output terminal, respectively, and is configured for noise reduction on the output terminal, the control circuit comprises a first transistor, a second transistor and a third transistor, a first electrode of the first transistor is directly connected to the second node and configured to control a level of the second node, a first electrode of the second transistor is connected to the third node, a second electrode of the second transistor is connected to a first voltage line to receive a first voltage, a gate electrode of the second transistor is directly connected to the first node, and the second transistor is configured to control a level of the third node in response to the level of the first node, a first electrode of the third transistor is connected to the third node and configured to control the level of the third node, and at least two selected from group consisting of an active layer of the first transistor, an active layer of the second transistor and an active layer of the third transistor extend in the first direction and are sequentially arranged in the first direction, wherein the control circuit further comprises: a fourth transistor and a fifth transistor, a first electrode of the fourth transistor is connected to the first voltage line to receive the first voltage, a second electrode of the fourth transistor is connected to the second node, a gate electrode of the fourth transistor is connected to a first control node, and the fourth transistor is configured to control the level of the second node in response to a level of the first control node;

a first electrode of the fifth transistor is connected to the first voltage line to receive the first voltage, a second electrode of the fifth transistor is connected to the second node, a gate electrode of the fifth transistor is connected to a reset signal line, and the fifth transistor is configured to reset the second node; and an active layer of the fourth transistor and an active layer of the fifth transistor extend in the first direction, respectively, and are arranged along a second direction, and the second direction intersects with the first direction.

18. A display substrate, comprising:

a base substrate; and a gate driving circuit provided on a peripheral region of the base substrate, wherein the gate driving circuit comprises a plurality of shift register circuits that are arranged in a first direction, each shift register circuit comprises an input circuit, a control circuit, an output circuit and an output noise reduction circuit, the input circuit is connected to an input terminal and configured to control a level of a first node in response to an input signal that is input by the input terminal, the control circuit is connected to the first node, a second node and a third node, the output circuit is connected to the third node and an output terminal, respectively, and is configured to provide an output signal to the output terminal, the output noise reduction circuit is connected to the second node and the output terminal, respectively, and is configured for noise reduction on the output terminal, the control circuit comprises a first transistor, a second transistor and a third transistor, a first electrode of the first transistor is connected to the second node and configured to control a level of the second node, a first electrode of the second transistor is connected to the third node, a second electrode of the second transistor is connected to a first voltage line to receive a first voltage, a gate electrode of the second transistor is connected to the first node, and the second transistor is configured to control a level of the third node in response to the level of the first node, a first electrode of the third transistor is connected to the third node and configured to control the level of the third node, and at least two selected from group consisting of an active layer of the first transistor, an active layer of the second transistor and an active layer of the third transistor extend in the first direction and are sequentially arranged in the first direction, wherein the control circuit further comprises: a fourth transistor and a fifth transistor, a first electrode of the fourth transistor is connected to the first voltage line to receive the first voltage, a second electrode of the fourth transistor is connected to the second node, a gate electrode of the fourth transistor is connected to a first control node, and the fourth transistor is configured to control the level of the second node in response to a level of the first control node;

a first electrode of the fifth transistor is connected to the first voltage line to receive the first voltage, a second electrode of the fifth transistor is connected to the second node, a gate electrode of the fifth transistor is connected to a reset signal line, and the fifth transistor is configured to reset the second node; and an active layer of the fourth transistor and an active layer of the fifth transistor extend in the first direction, respectively, and are arranged along a second direction, and the second direction intersects with the first direction.

\* \* \* \* \*